(12) United States Patent
Min et al.

(10) Patent No.: US 11,778,877 B2
(45) Date of Patent: Oct. 3, 2023

(54) DISPLAY DEVICE INCUDING HOLE REGION IN DISPLAY AREA

(71) Applicant: SAMSUNG DISPLAY CO., LTD., Yongin-si (KR)

(72) Inventors: Junyoung Min, Yongin-si (KR); Jaewon Kim, Yongin-si (KR); Junwon Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 120 days.

(21) Appl. No.: 17/465,193

(22) Filed: Sep. 2, 2021

(65) Prior Publication Data

US 2022/0208929 A1 Jun. 30, 2022

(30) Foreign Application Priority Data

Dec. 24, 2020 (KR) ........................ 10-2020-0183612

(51) Int. Cl.
*H01L 27/14* (2006.01)
*H10K 59/131* (2023.01)
(Continued)

(52) U.S. Cl.
CPC ....... *H10K 59/131* (2023.02); *H10K 59/1213* (2023.02); *H10K 59/65* (2023.02);
(Continued)

(58) Field of Classification Search
CPC .. H10K 59/131; H10K 59/1213; H10K 59/65; H10K 59/12; H01L 27/1225;
(Continued)

(56) References Cited

U.S. PATENT DOCUMENTS 6,864,130 B2 3/2005 Koo et al.
8,350,792 B2 1/2013 Igeta et al.
(Continued)

FOREIGN PATENT DOCUMENTS

JP 201032760 A 2/2010
KR 100496287 B1 6/2005
(Continued)

*Primary Examiner* — Tan N Tran
(74) *Attorney, Agent, or Firm* — CANTOR COLBURN LLP

(57) ABSTRACT

A display device includes: a substrate in which a transmission area, a display area, a non-display area and the display area, and a peripheral area are defined; pixels arranged on the display area; initialization gate lines and compensation gate lines extending along pixel rows; gate driving circuits disposed on the peripheral area; and gate connection lines disposed on the non-display area. A k-th gate driving circuit among the gate driving circuits simultaneously drives m-th and (m+1)-th initialization gate lines and n-th and (n+1)-th compensation gate lines. First portions of the n-th and (n+1)-th compensation gate lines and second portions of the n-th and (n+1)-th compensation gate lines, which are physically apart from each other by the transmission area, are electrically connected to each other through a first gate connection line among gate connection lines.

26 Claims, 13 Drawing Sheets

(51) Int. Cl.
  *H10K 59/65* (2023.01)
  *H10K 59/121* (2023.01)
  *H01L 29/786* (2006.01)
  *H01L 27/12* (2006.01)
(52) U.S. Cl.
  CPC ........ *H01L 27/124* (2013.01); *H01L 27/1225* (2013.01); *H01L 27/1251* (2013.01); *H01L 29/7869* (2013.01); *H01L 29/78675* (2013.01)
(58) Field of Classification Search
  CPC ............... H01L 27/124; H01L 27/1251; H01L 29/78675; H01L 29/7869; H01L 29/78648; H01L 27/1248; H01L 27/3276; H01L 27/3244; H01L 27/3234; H01L 27/3262; H01L 27/323; G09G 3/3208; G09G 2300/0426; G09G 3/20; G09G 3/32; G09G 3/3266; G09F 9/30; G09F 9/33

USPC .............................................. 257/40, 59, 72
See application file for complete search history.

(56) References Cited

U.S. PATENT DOCUMENTS

| | | | |
|---|---|---|---|
| 11,515,380 B2* | 11/2022 | Cha | ........................ H01L 27/124 |
| 2019/0385523 A1 | 12/2019 | Na et al. | |
| 2020/0176527 A1 | 6/2020 | An et al. | |
| 2020/0176551 A1 | 6/2020 | Park et al. | |

FOREIGN PATENT DOCUMENTS

| | | |
|---|---|---|
| KR | 1020190143806 A | 12/2019 |
| KR | 1020200066471 A | 6/2020 |
| KR | 1020200066502 A | 6/2020 |

* cited by examiner

DISPLAY DEVICE INCUDING HOLE REGION IN DISPLAY AREA

This application claims priority to Korean Patent Application No. 10-2020-0183612, filed on Dec. 24, 2020, and all the benefits accruing therefrom under 35 U.S.C. § 119, the content of which in its entirety is herein incorporated by reference.

BACKGROUND

1. Field

One or more embodiments relate to a display device.

2. Description of the Related Art

Display devices are configured to display data visually. Display devices may be used as displays for small products such as mobile phones or large products such as televisions.

Display devices may include a substrate partitioned into a display area and a non-display area, and a gate line and a data line are insulated from each other in the display area. A plurality of pixel areas is defined in the display area, and pixels in each of the pixel areas receive electric signals from the gate line and the data line crossing each other and emit light to display an image to an outside. A thin-film transistor and a pixel electrode electrically connected to the thin-film transistor are provided in each of the pixel areas, and an opposite electrode is commonly provided in each of the pixel areas. In such display devices, various lines configured to transmit electric signals to pixels in the display area, pads connectable to a gate driver, a data driver, and a controller, and the like may be provided in the non-display area.

Recently, the usage of display devices has diversified. Also, display devices have become thinner and more lightweight, and thus, the use of display devices has expanded. As the display devices are more widely used in various fields, studies have been conducted to give users visual satisfaction, such as expanding a display area of a display device. Various studies are being attempted to expand a display area.

SUMMARY

One or more embodiments include a display device in which a non-display area is reduced.

According to an embodiments, a display device includes a substrate in which a transmission area, a display area surrounding at least a portion of the transmission area, a non-display area between the transmission area and the display area, and a peripheral area outside the display area are defined, a plurality of pixels disposed on the display area in pixel rows and pixel columns, a plurality of initialization gate lines and a plurality of compensation gate lines respectively extending along the pixel rows, a plurality of gate driving circuits disposed on the peripheral area and arranged in a direction of the pixel columns, and a plurality of gate connection lines disposed on the non-display area, where a k-th gate driving circuit among the plurality of gate driving circuits simultaneously drives m-th and (m+1)-th initialization gate lines among the plurality of initialization gate lines and n-th and (n+1)-th compensation gate lines among the plurality of compensation gate lines, each of the m-th and (m+1)-th initialization gate lines and the n-th and (n+1)-th compensation gate lines includes a first portion and a second portion which are physically apart from each other by the transmission area, and the first portion and the second portion of each of the n-th and (n+1)-th compensation gate lines are electrically connected to each other through a first gate connection line among the plurality of gate connection lines, where k and n are a natural number, and m is a natural number greater than n+1.

According to an embodiment, an even number of pixel rows may be between an (n+1)-th pixel row and an m-th pixel row.

According to an embodiment, the first portion and the second portion of each of the m-th and (m+1)-th initialization gate lines may be electrically connected to each other through a second gate connection line among the plurality of gate connection lines.

According to an embodiment, the first gate connection line may electrically connect the first portion and the second portion of each of the m-th and (m+1)-th initialization gate lines to each other.

According to an embodiment, two pixel rows may be between an (n+1)-th pixel row and an m-th pixel row, n-th and (n+1)-th initialization gate lines among the plurality of initialization gate lines may be simultaneously driven by a (k−2)-th gate driving circuit among the plurality of gate driving circuits, and m-th and (m+1)-th compensation gate lines among the plurality of compensation gate lines may be simultaneously driven by a (k+2)-th gate driving circuit among the plurality of gate driving circuits.

According to an embodiment, an m-th pixel row may be a pixel row next to an (n+1)-th pixel row.

According to an embodiment, the first gate connection line may electrically connect the first portion and the second portion of each of the m-th and (m+1)-th initialization gate lines to each other.

According to an embodiment, the first portion and the second portion of each of the m-th and (m+1)-th initialization gate lines may be electrically connected to each other through a second gate connection line among the plurality of gate connection lines.

According to an embodiment, n-th and (n+1)-th initialization gate lines among the plurality of initialization gate lines may be simultaneously driven by a (k−1)-th gate driving circuit among the plurality of gate driving circuits, and m-th and (m+1)-th compensation gate lines among the plurality of compensation gate lines may be simultaneously driven by a (k+1)-th gate driving circuit among the plurality of gate driving circuits.

According to an embodiment, the m+1 may be equal to 2 k.

According to an embodiment, the k-th gate driving circuit may include a one-side gate driving circuit disposed on one side of the peripheral area, where the one-side gate driving circuit may output a first gate signal to the first portion of each of the m and (m+1)-th initialization gate lines and the first portion of each of the n-th and (n+1)-th compensation gate lines, and an other-side gate driving circuit disposed on another side of the peripheral area, where the other-side gate driving circuit may output a second gate signal to the second portion of each of the m and (m+1)-th initialization gate lines and the second portion of each of the n-th and (n+1)-th compensation gate lines.

According to an embodiment, the display device may further include a plurality of scan lines respectively extending along the pixel rows, a plurality of scan driving circuits arranged on the peripheral area and arranged in a direction of the pixel columns, where the plurality of scan driving circuits may sequentially drive the plurality of scan lines, and a plurality of scan connection lines disposed on the non-display area, where each of n-th and (n+1)-th scan lines among the plurality of scan lines may include a first portion and a second portion which are physically apart from each other by the transmission area, the first portion and the second portion of the n-th scan line are electrically connected to each other through a first scan connection line among the plurality of scan connection lines, and the first portion and the second portion of the (n+1)-th scan line are electrically connected to each other through a second scan connection line among the plurality of scan connection lines.

According to an embodiment, the first scan connection line may include a first scan connection electrode electrically connecting the first portion of the n-th scan line to the second portion of the n-th scan line, and a second scan connection electrode electrically connecting the first portion of the n-th scan line to the second portion of the n-th scan line.

According to an embodiment, the display device may further include a first conductive layer including the first scan connection electrode, a semiconductor layer on the first conductive layer, and a second conductive layer on the semiconductor layer and including the second scan connection electrode.

According to an embodiment, the display device may further include a plurality of emission control lines respectively extending along the pixel rows, and a plurality of emission control driving circuits disposed on the peripheral area and arranged in a direction of the pixel columns, where each of n-th and (n+1)-th emission control lines among the plurality of emission control lines may include a first portion and a second portion which are physically apart and electrically insulated from each other by the transmission area, the first portion of the n-th emission control line and the first portion of the (n+1)-th emission control line may be simultaneously driven by a first emission control driving circuit on one side of the peripheral area among the plurality of emission control driving circuits, and the second portion of the n-th emission control line and the second portion of the (n+1)-th emission control line may be simultaneously driven by a second emission control driving circuit on another side of the peripheral area among the plurality of emission control driving circuits.

According to an embodiment, the display device may further include a plurality of emission control lines respectively extending along the pixel rows, a plurality of emission control driving circuits disposed on the peripheral area and arranged in a direction of the pixel columns, and an emission control connection line disposed on the non-display area, where each of n-th and (n+1)-th emission control lines among the plurality of emission control lines may include a first portion and a second portion which are physically apart from each other by the transmission area, and the first portion and the second portion of each of the n-th and (n+1)-th emission control lines may be electrically connected to each other through the emission control connection line.

According to an embodiment, each of pixels arranged in an n-th pixel row among the plurality of pixels may include a light-emitting element, a driving transistor which controls a current flowing to the light-emitting element based on a gate-source voltage, a scan transistor which transmits a data voltage to the driving transistor in response to a scan signal, a gate initialization transistor which applies an initialization voltage to a gate of the driving transistor in response to a signal transmitted through an n-th initialization gate line among the plurality of initialization gate lines, and a compensation transistor which connects a drain of the driving transistor to the gate of the driving transistor in response to a signal transmitted through the n-th compensation gate line.

According to an embodiment, a conductivity type of each of the gate initialization transistor and the compensation transistor may be opposite to a conductivity type of the scan transistor.

According to an embodiment, the display device may further include a first semiconductor layer including an active region of the scan transistor, a second semiconductor layer including an active region of the gate initialization transistor and an active region of the compensation transistor, and a conductive layer between the first semiconductor layer and the second semiconductor layer.

According to an embodiment, the first semiconductor layer may include a silicon semiconductor material, and the second semiconductor layer may include an oxide semiconductor material.

According to an embodiment, an on-duration length of the signal transmitted through the n-th compensation gate line may be equal to twice an on-duration length of the scan signal or greater than the on-duration length of the scan signal.

According to an embodiment, a through hole may be defined through the substrate to correspond to the transmission area.

According to an embodiment, a display device includes a substrate in which a transmission area, a display area surrounding at least a portion of the transmission area, a non-display area between the transmission area and the display area, and a peripheral area outside the display area are defined, a plurality of pixels arranged on the display area in pixel rows and pixel columns, a plurality of gate lines respectively arranged in the pixel rows, and a plurality of gate connection lines disposed on the non-display area, where each of m-th and (m+1)-th gate lines and n-th and (n+1)-th gate lines includes a first portion and a second portion which are physically apart from each other by the transmission area, the first portion of each of the m-th, (m+1)-th, n-th, and (n+1)-th gate lines are connected to each other in the peripheral area, and the first portion and the second portion of each of the m-th and (m+1)-th gate lines are electrically connected to each other through a first gate connection line among the plurality of gate connection lines, where n is a natural number, and m is a natural number greater than n+1).

According to an embodiment, the first portion and the second portion of each of the n-th and (n+1)-th gate lines a may be electrically connected to each other through a second gate connection line among the plurality of gate connection lines.

According to an embodiment, the first gate connection line may electrically connect the first portion and the second portion of each of the n-th and (n+1)-th gate lines to each other.

According to an embodiment, the second portion of each of the m-th, (m+1)-th, n-th, and (n+1)-th gate lines are connected to each other in the peripheral area.

Other features of the disclosure will become better understood through the accompanying drawings, the claims and the detailed description.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
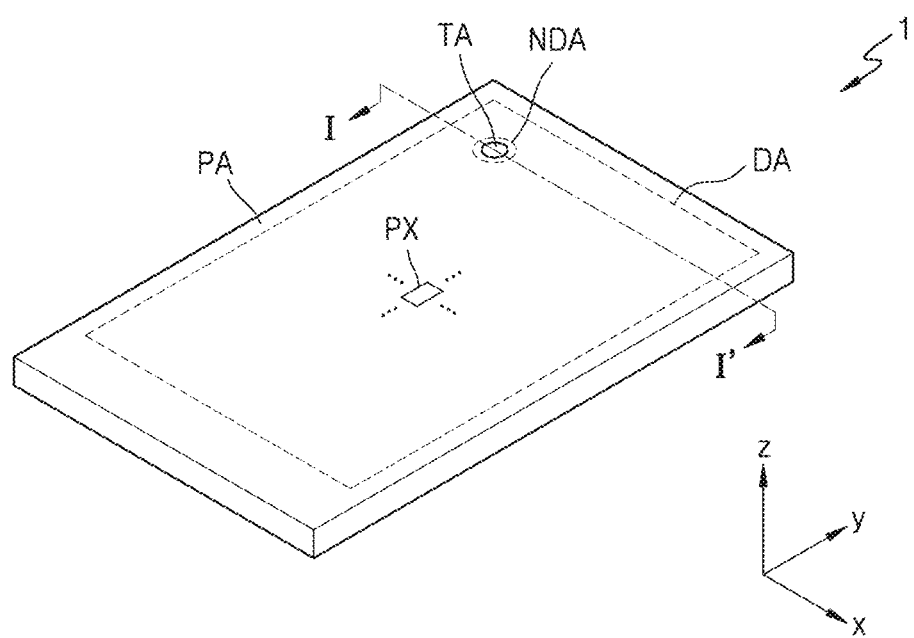
FIG. 1 is a schematic perspective view of an electronic apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Sizes of elements in the drawings may be exaggerated or reduced for convenience of explanation. For example, because sizes and thicknesses of elements in the drawings are arbitrarily illustrated for convenience of description, the disclosure is not limited thereto.

When a certain embodiment may be implemented differently, a specific process order may be performed differently from the described order. For example, two consecutively described processes may be performed substantially at the same time or performed in an order opposite to the described order.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a schematic perspective view of an electronic apparatus 1 according to an embodiment.

Referring to FIG. 1, an embodiment of the electronic apparatus 1 is configured to display a moving image or a still image and may define a display screen for various products, including not only portable electronic apparatuses, such as mobile phone, smart phone, tablet personal computer ("PC"), mobile communication terminal, electronic notebook, e-book, portable multimedia player ("PMP"), navigation, and ultra mobile PC ("UMPC"), and but also television ("TV"), laptop computer, monitor, billboard, and internet of things ("IOT") devices.

An embodiment of the electronic apparatus 1 may also be used in wearable device, such as smart watch, watch phone, glasses-type display, or head mounted display ("HMD").

Alternatively, the electronic apparatus 1 may also be used as dashboard of automobile, center information display ("CID") on the center fascia or dashboard of automobile, room mirror display that replace side mirror of automobile, and displays arranged on the rear sides of front seats to serve as entertainment devices for backseat passengers of automobiles. In FIG. 1, for convenience of illustration and description, an embodiment where the electronic apparatus 1 is used as a smartphone is shown.

An embodiment of the electronic apparatus 1 may have a rectangular shape in a plan view. In one embodiment, for example, as illustrated in FIG. 1, the electronic apparatus 1 may have a rectangular planar shape having a short side in ±x directions and a long side in ±y directions. An edge at which the short side in the ±x directions and the long side in the ±y directions meet each other may be rounded to have a certain curvature or may be formed to have a right angle. The planar shape of the electronic apparatus 1 is not limited to a rectangle, but may have another polygonal shape, an elliptical shape, or an irregular shape.

In an embodiment, the electronic apparatus 1 may include a transmission area TA and a display area DA surrounding at least a portion of the transmission area TA. The electronic apparatus 1 may include a non-display area NDA between the transmission area TA and the display area DA, and a peripheral area PA outside the display area DA. In one embodiment, for example, the peripheral area PA may surround the display area DA.

The transmission area TA may be positioned inside the display area DA. According to an embodiment, as illustrated in FIG. 1, the transmission area TA may be on the upper left side of the display area DA. Alternatively, the transmission area TA may be variously arranged. In one embodiment, for example, the transmission area TA may be arranged in the center of the display area DA, or may be arranged on the upper right side of the display area DA. Herein, "left," "right," "upper," and "lower" refer to directions when viewed in a plan view of the electronic apparatus 1 in the vertical direction or a thickness of the electronic apparatus 1. In one embodiment, for example, "left" refers to the −x direction, "right" refers to the +x direction, "upper" refers to the +y direction, and "lower" refers to the −y direction. FIG. 1 illustrates an embodiment where a single transmission area TA is arranged, but in an alternative embodiment, a plurality of transmission areas TA may be provided.

The electronic apparatus 1 may provide an image by using a plurality of pixels PX in the display area DA. Each of the pixels PX may include a display element. Each of the pixels PX may include a display element such as an organic light-emitting diode. Each of the pixels PX may emit, for example, red light, green light, blue light, or white light from the organic light-emitting diode. Hereinafter, the pixels PX may refer to sub-pixels that emit light of different colors from each other. Each of the pixels PX may be, for example, one of a red sub-pixel, a green sub-pixel, and a blue sub-pixel.

Figure 2:
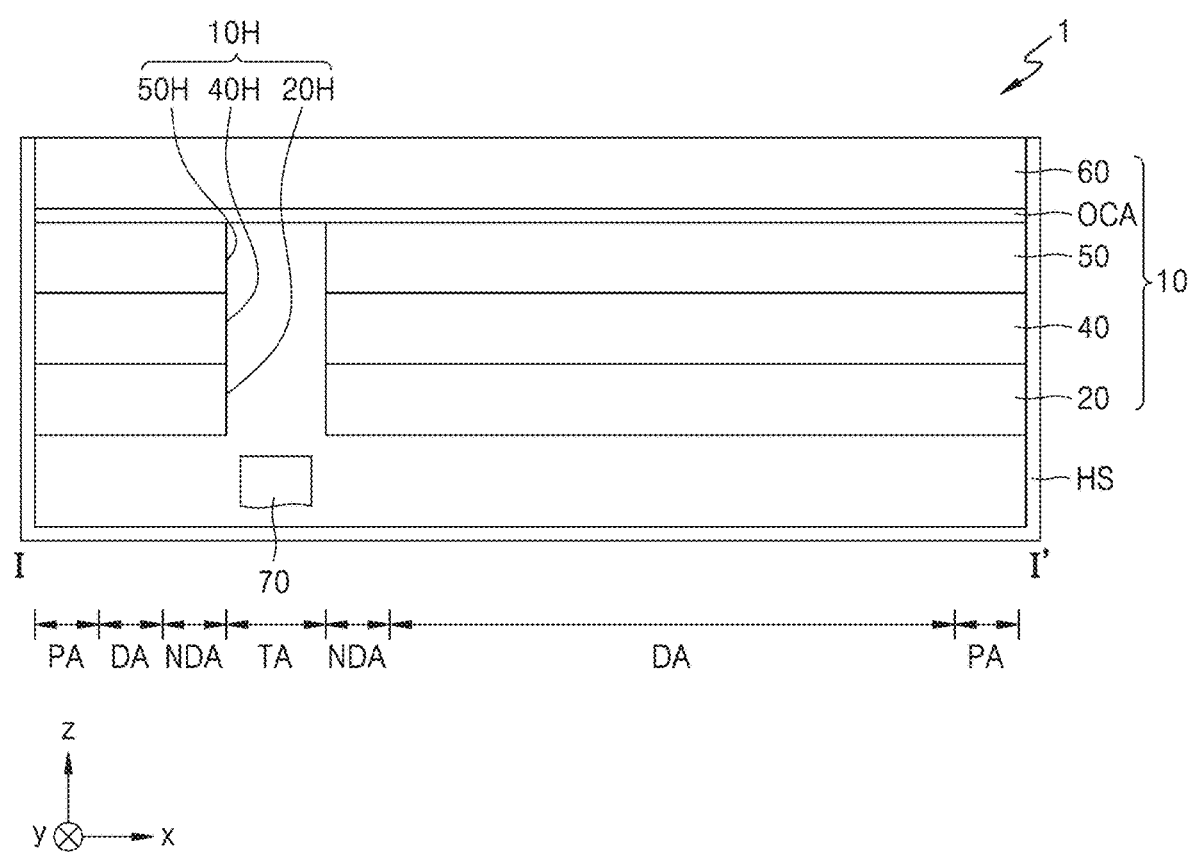
FIG. 2 is a cross-sectional view of the electronic apparatus taken along line I-I' of FIG. 1.

FIG. 2 is a cross-sectional view of the electronic apparatus 1 taken along line I-I' of FIG. 1.

Referring to FIG. 2, the electronic apparatus 1 may include a display device 10 and a component 70 below the display device to overlap a transmission area TA of the display device 10. The display device 10 and the component 70 may be accommodated in a housing HS.

The display device 10 may include a display element layer 20, an input sensing layer 40, an optical functional layer 50, and a cover window 60.

The display element layer 20 may include display elements (or light-emitting elements) that emit light to display an image. The display element may include a light-emitting diode, for example, an organic light-emitting diode including an organic emission layer.

According to an alternative embodiment, the light-emitting diode may include an inorganic light-emitting diode including an inorganic material. The inorganic light-emitting diode may include a PN junction diode including inorganic semiconductor-based materials. In such an embodiment, when a voltage is applied to the PN junction diode in a forward direction, holes and electrons may be injected and recombined to generate energy. The PN junction diode may convert the generated energy into light energy to emit light of a certain color. The inorganic light-emitting diode may have a width of several micrometers to several hundred micrometers. According to an embodiment, the inorganic light-emitting diode may be referred to as a micro light-emitting diode. According to an alternative embodiment, the display element layer 20 may include a quantum dot light-emitting diode.

In such embodiments, an emission layer of the display element layer 20 may include an organic material, an inorganic material, quantum dots, an organic material and quantum dots, or an inorganic material and quantum dots.

The input sensing layer 40 may obtain coordinate information corresponding to an external input, for example, a touch event. The input sensing layer 40 may include a sensing electrode (or a touch electrode) and trace lines electrically connected to the sensing electrode. The input sensing layer 40 may be above the display element layer 20.

The input sensing layer 40 may sense an external input by using a mutual cap method and/or a self-cap method.

The input sensing layer 40 may be formed directly on the display element layer 20, or may be separately formed and then bonded to the display element layer 20 through an adhesive layer such as an optical clear adhesive ("OCA"). In one embodiment, for example, the input sensing layer 40 may be continuously formed after the process of forming the display element layer 20. In such an embodiment, the adhesive layer may not be between the input sensing layer 40 and the display element layer 20. FIG. 2 illustrates an embodiment where the input sensing layer 40 is between the display element layer 20 and the optical functional layer 50, but in an alternative embodiment, the input sensing layer 40 may be above the optical functional layer 50.

The optical functional layer 50 may include an anti-reflective layer. The anti-reflective layer may reduce reflectance of light (external light) incident from the outside toward the display device 10 through the cover window 60. The anti-reflective layer may include a retarder and a polarizer. The retarder may be a film-type retarder or a liquid crystal coating-type retarder. Also, the polarizer may be a film-type polarizer or a liquid crystal coating-type polarizer. The film-type polarizer may include a stretched synthetic resin film, and the liquid crystal coating-type polarizer may include liquid crystals arranged in a certain array.

According to an alternative embodiment, the anti-reflective layer may include a black matrix and color filters. The color filters may be arranged based on arrangement of the color of light emitted from each light-emitting diode of the display element layer 20. According to an alternative embodiment, the anti-reflective layer may include a destructive interference structure. The destructive interference structure may include a first reflective layer and a second reflective layer, which are on different layers from each other. First reflected light and second reflected light, which are respectively reflected from the first reflective layer and the second reflective layer, may destructively interfere with each other. Thus, reflectance of external light is reduced.

The optical functional layer 50 may include a lens layer. The lens layer may improve light emission efficiency of light emitted from the display element layer 20, or may reduce color deviation. The lens layer may include a layer having a concave or convex lens shape, or/and may include a plurality of layers having different refractive indices from each other. The optical functional layer 50 may include either or both of the anti-reflective layer and the lens layer described above.

In an embodiment, the display device 10 may include openings 10H, that is, the openings 10H may be defined through the display device 10. Herein, when an elements is described as including an opening, it means the opening is defined through the element. In an embodiment, as shown in FIG. 2, the display element layer 20, the input sensing layer 40, and the optical functional layer 50 include first to third openings 20H, 40H, and 50H, respectively, and the first to third openings 20H, 40H, and 50H overlap each other.

The first opening 20H may extend through the bottom surface of the display element layer 20 from the top surface of the display element layer 20, the second opening 40H may extend through the bottom surface of the input sensing layer 40 from the top surface of the input sensing layer 40, and the third opening 50H may extend through the bottom surface of the optical functional layer 50 from the top surface of the optical functional layer 50.

The openings 10H of the display device 10, for example, the first to third openings 20H, 40H, and 50H, may be positioned to overlap each other in the transmission area TA.

In an embodiment, the first to third openings 20H, 40H, and 50H may have a same size (or diameter) as each other. Alternatively, the first to third openings 20H, 40H, and 50H may have different sizes (or diameters) from each other.

According to an alternative embodiment, at least one selected from the display element layer 20, the input sensing layer 40, and the optical functional layer 50 may not include an opening. In one embodiment, for example, one or two elements selected from the display element layer 20, the input sensing layer 40, and the optical functional layer 50 may not include an opening.

The cover window 60 may be on the optical functional layer 50. The cover window 60 may be bonded to the optical functional layer 50 through an adhesive layer such as an OCA therebetween. The cover window 60 may include a glass material or a plastic material. The plastic material may include polyethersulfone, polyacrylate, polyetherimide, polyethylene naphthalate, polyethylene terephthalate, polyphenylene sulfide, polyarylate, polyimide, polycarbonate, or cellulose acetate propionate.

The cover window 60 may include a flexible window. In one embodiment, for example, the cover window 60 may include a polyimide window or an ultra-thin glass window.

The transmission area TA may be a type of a component area (e.g., a sensor area, a camera area, a speaker area, etc.) in which the component 70 for adding various functions to the electronic apparatus 1 is positioned. The component 70 may be arranged to overlap the opening 10H of the display device 10.

The component 70 may include an electronic element. In one embodiment, for example, the component 70 may include an electronic element using light or sound. In one embodiment, for example, the electronic element may include a sensor (e.g., an infrared sensor) using light, a camera configured to receive light to capture an image, a sensor configured to measure a distance or recognizes a fingerprint by outputting and sensing light or sound, a small lamp configured to output light, a speaker configured to output sound, and the like.

The electronic element using light may use light of various wavelength bands such as visible light, infrared light, and ultraviolet light. The transmission area TA may correspond to an area through which light or/and sound that is output from the component 70 to the outside or directed from the outside to the electronic element may be transmitted.

According to an alternative embodiment, where the electronic apparatus 1 is used as a smart watch or a dashboard for a vehicle, the component 70 may include a member including a clock hand or a needle indicating certain information (e.g., vehicle velocity, etc.). In such an embodiment, the cover window 60 may include an opening in the transmission area TA, such that the component 70 such as a needle is exposed to the outside. In an embodiment, where the electronic apparatus 1 includes the component 70 such as a speaker, the cover window 60 may also include an opening corresponding to the transmission area TA.

Figure 3:
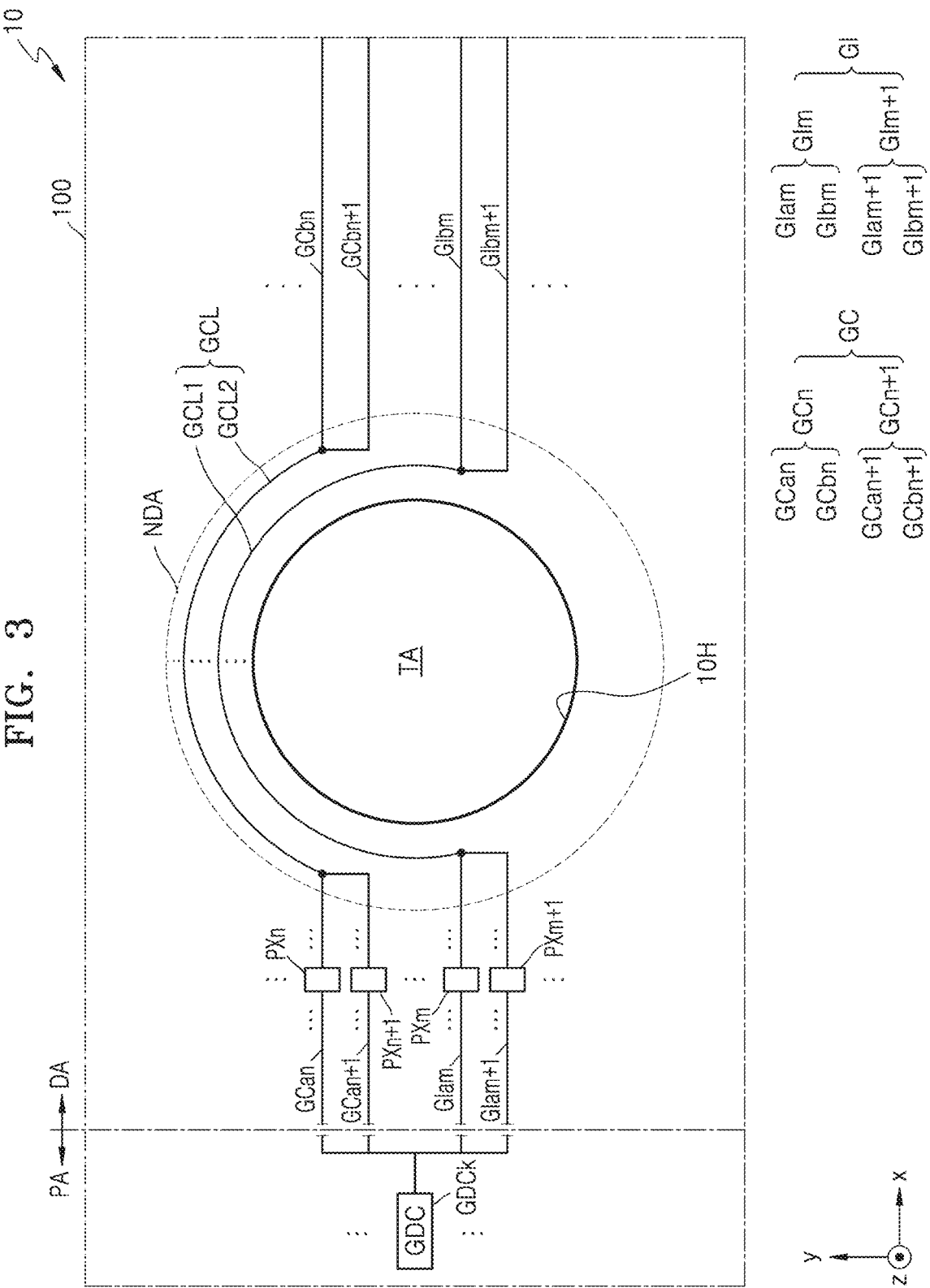
FIG. 3 is a schematic enlarged plan view of a display device according to an embodiment.

FIG. 3 is a schematic enlarged plan view of a display device 10 according to an embodiment.

Referring to FIG. 3, an embodiment of the display device 10 may include a transmission area TA, a display area DA, a non-display area NDA, and a peripheral area PA. The non-display area NDA may surround at least a portion of the transmission area TA. The non-display area NDA is an area in which no display elements such as an organic light-emitting diode are arranged. As will be described later, signal lines configured to provide signals to pixels PX around the transmission area TA may pass or extend through the non-display area NDA. The display device 10 may include an opening 10H corresponding to the transmission area TA.

In an embodiment, the display device 10 includes a substrate 100, such that the substrate may be described as including (or defines) the transmission area TA, the display area DA, the non-display area NDA, and the peripheral area PA. In such an embodiment, the substrate 100 may include an opening corresponding to the transmission area TA.

The display device 10 may include a plurality of pixels PX in the display area DA. The pixels PX may be arranged in pixels rows and pixel columns. The pixel rows may extend in a row direction (e.g., ±x direction), and the pixel columns may extend in a column direction (e.g., ±y direction).

Figure 8:
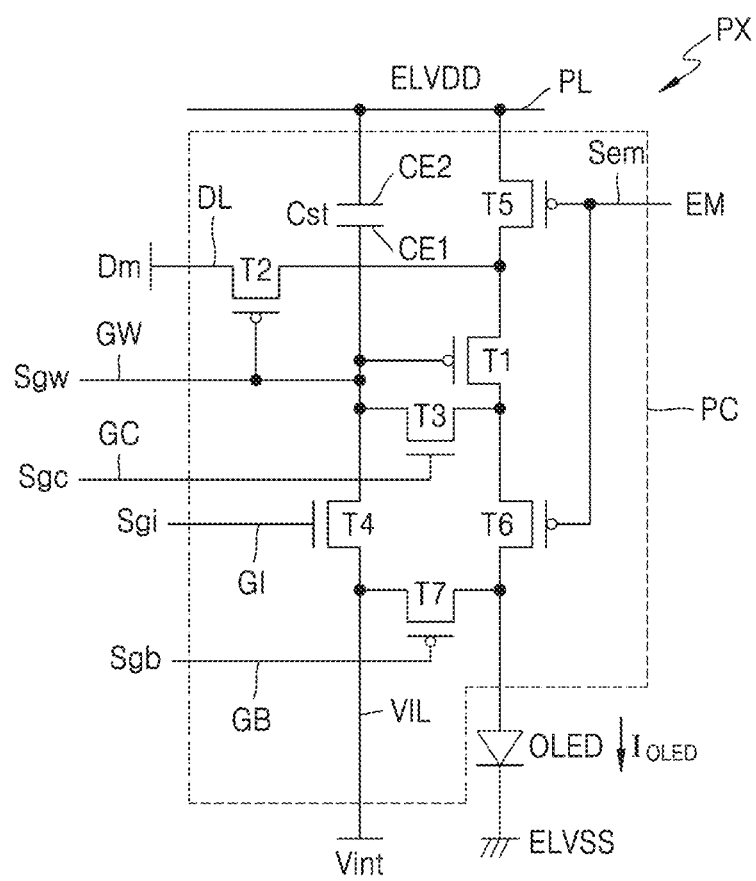
FIG. 8 is a schematic equivalent circuit diagram of a pixel of a display device, according to an embodiment.

The display device 10 may display an image by using light emitted from light-emitting diodes of the pixels PX, for example, red light, green light, and blue light. The light-emitting diodes of the pixels PX may include organic light-emitting diodes OLED, as will be described later with reference to FIG. 8. The organic light-emitting diodes OLED may be electrically connected to pixel circuits PC. FIG. 8 illustrates an embodiment where the light-emitting diode includes the organic light-emitting diode OLED, but in an alternative embodiment, as described above, the display device 10 may include the inorganic light-emitting diode instead of the organic light-emitting diode OLED.

The pixels PX may be electrically connected to outer circuits in the peripheral area PA. A plurality of gate driving circuits GDC may be in the peripheral area PA. In an embodiment, as illustrated in FIG. 3, the gate driving circuits GDC may be arranged on the peripheral area PA in the column direction (e.g., ±x direction).

The gate driving circuits GDC may be connected to a plurality of compensation gate lines GC and a plurality of initialization gate lines GI arranged in the pixel rows. The gate driving circuits GDC may be connected to the compensation gate lines GC and the initialization gate lines GI extending in the row direction (e.g., ±x direction).

Each of the compensation gate lines GC may be connected to the pixels PX positioned in a same row. The compensation gate lines GC may be configured to sequentially transmit electric signals to the pixels PX positioned in the same row. In one embodiment, for example, as illustrated in FIG. 3, an n-th compensation gate line GCn among the compensation gate lines GC may be connected to n-th pixels PXn positioned in an n-th row, and may be configured to sequentially transmit electric signals to the n-th pixels PXn. In such an embodiment, an (n+1)-th compensation gate line GCn+1 among the compensation gate lines GC may be connected to (n+1)-th pixels PXn+1 positioned in an (n+1)-th row, and may be configured to sequentially transmit electric signals to the (n+1)-th pixels PXn+1. Here, n is a natural number.

Each of the initialization gate lines GI may be connected to the pixels PX positioned in a same row. The initialization gate lines GI may be configured to sequentially transmit electric signals to the pixels PX positioned in the same row. In one embodiment, for example, as illustrated in FIG. 3, an m-th initialization gate line GIm among the initialization gate lines GI may be connected to m-th pixels PXm positioned in an m-th row, and may be configured to sequentially transmit electric signals to the m-th pixels PXm. In such an embodiment, an (m+1)-th initialization gate line GIm+1 among the initialization gate lines GI may be connected to (m+1)-th pixels PXm+1 positioned in an (m+1)-th row, and may be configured to sequentially transmit electric signals to the (m+1)-th pixels PXm+1. Here, m is a natural number greater than n+1.

Because m is greater than n+1, a plurality of pixel rows may be between the (n+1)-th pixel row and the m-th pixel row. In one embodiment, for example, an even number of pixel rows may be between the (n+1)-th pixel row and the m-th pixel row. In one embodiment, for example, two pixel rows may be between the (n+1)-th pixel row and the m-th pixel row.

Alternatively, the m-th pixel row may be a pixel row next to or immediately subsequent to the (n+1)-th pixel row. In such an embodiment, m may be n+2.

According to an embodiment, the gate driving circuits GDC may simultaneously drive the compensation gate lines GC and simultaneously drive the initialization gate lines GI. The compensation gate lines GC and the initialization gate lines GI, which are driven by a same gate driving circuit GDC, may be connected to each other in the peripheral area PA.

In one embodiment, for example, as illustrated in FIG. 3, a k-th gate driving circuit GDCk among the gate driving circuits GDC may simultaneously drive the n-th compensation gate line GCn and the (n+1)-th compensation gate line GCn+1 among the compensation gate lines GC and the m-th initialization gate line GIm and the (m+1)-th initialization gate line GIm+1 among the initialization gate lines GI. The n-th compensation gate line GCn, the (n+1)-th compensation gate line GCn+1, the m-th initialization gate line GIm, and the (m+1)-th initialization gate line GIm+1 may be connected to each other in the peripheral area PA. Here, k is a natural number.

FIG. 3 illustrates an embodiment where each of the gate driving circuits GDC simultaneously drives two compensation gate lines GC and two initialization gate lines GI, but the number of compensation gate lines GC and/or the number of initialization gate lines GI, which are simultaneously driven by each of the gate driving circuits GDC, may be variously changed.

According to an embodiment, each of the compensation gate lines GC adjacent to the transmission area TA in the row direction (e.g., ±x direction) may have a first portion and a second portion that are physically apart from each other by the transmission area TA. In one embodiment, for example, as illustrated in FIG. 3, the n-th compensation gate line GCn among the compensation gate lines GC may have a first portion GCan and a second portion GCbn that are physically apart from each other by the transmission area TA. The (n+1)-th compensation gate line GCn+1 among the compensation gate lines GC may have a first portion GCan+1 and a second portion GCbn+1 that are physically apart from each other by the transmission area TA.

According to an embodiment, each of the initialization gate lines GI adjacent to the transmission area TA in the row direction (e.g., ±x direction) may have a first portion and a second portion that are physically apart from each other by the transmission area TA. In one embodiment, for example, as illustrated in FIG. 3, the m-th initialization gate line GIm among the initialization gate lines GI may have a first portion GIam and a second portion GIbm that are physically apart from each other by the transmission area TA. The (m+1)-th initialization gate line GIm+1 among the initialization gate lines GI may have a first portion GIam+1 and a second portion GIbm+1 that are physically apart from each other by the transmission area TA.

A plurality of gate connection lines GCL may be on the non-display area NDA between the transmission area TA and the display area DA. Each of the gate connection lines GCL may bypass the non-display area NDA along the edge of the opening 10H of the display device 10 formed or defined in the transmission area TA.

In an embodiment, the gate connection lines GCL may electrically connect first portions to second portions of the compensation gate lines GC apart from each other. In such an embodiment, the gate connection lines GCL may electrically connect first portions to second portions of the initialization gate lines GI apart from each other.

In one embodiment, for example, as illustrated in FIG. 3, the first portion GCan of the n-th compensation gate line GCn and the first portion GCan+1 of the (n+1)-th compensation gate line GCn+1, and the second portion GCbn of the n-th compensation gate line GCn and the second portion GCbn+1 of the (n+1)-th compensation gate line GCn+1 may be electrically connected to each other through a first gate connection line GCL1 among the gate connection lines GCL. In such an embodiment, the first portion GIam of the m-th initialization gate line GIm and the first portion GIam+1 of the (m+1)-th initialization gate line GIm+1, and the second portion GIbm of the m-th initialization gate line GIm and the second portion GIbm+1 of the (m+1)-th initialization gate line GIm+1 may be electrically connected to each other through a second gate connection line GCL2 among the gate connection lines GCL.

In an embodiment, as described above, the first portions and the second portions of the compensation gate lines GC driven by a same gate driving circuit GDC may be electrically connected to each other through one gate connection line GCL. The first portions and the second portions of the initialization gate lines GI driven by the same gate driving circuit GDC may be electrically connected to each other through one gate connection line GCL. In such an embodiment, because the number of gate connection lines GCL bypassing the transmission area TA decreases, the non-display area NDA may be reduced. Therefore, the display area DA may relatively increase.

In such an embodiment, because the first portions and the second portions of the compensation gate lines GC apart from each other by the transmission area TA are connected to each other through the gate connection lines GCL, electric signals may be transmitted to the second portions of the compensation gate lines GC. In such an embodiment, because the first portions and the second portions of the initialization gate lines GI apart from each other by the transmission area TA are connected to each other through the gate connection lines GCL, electric signals may be transmitted to the second portions of the initialization gate lines GI.

Figure 9:
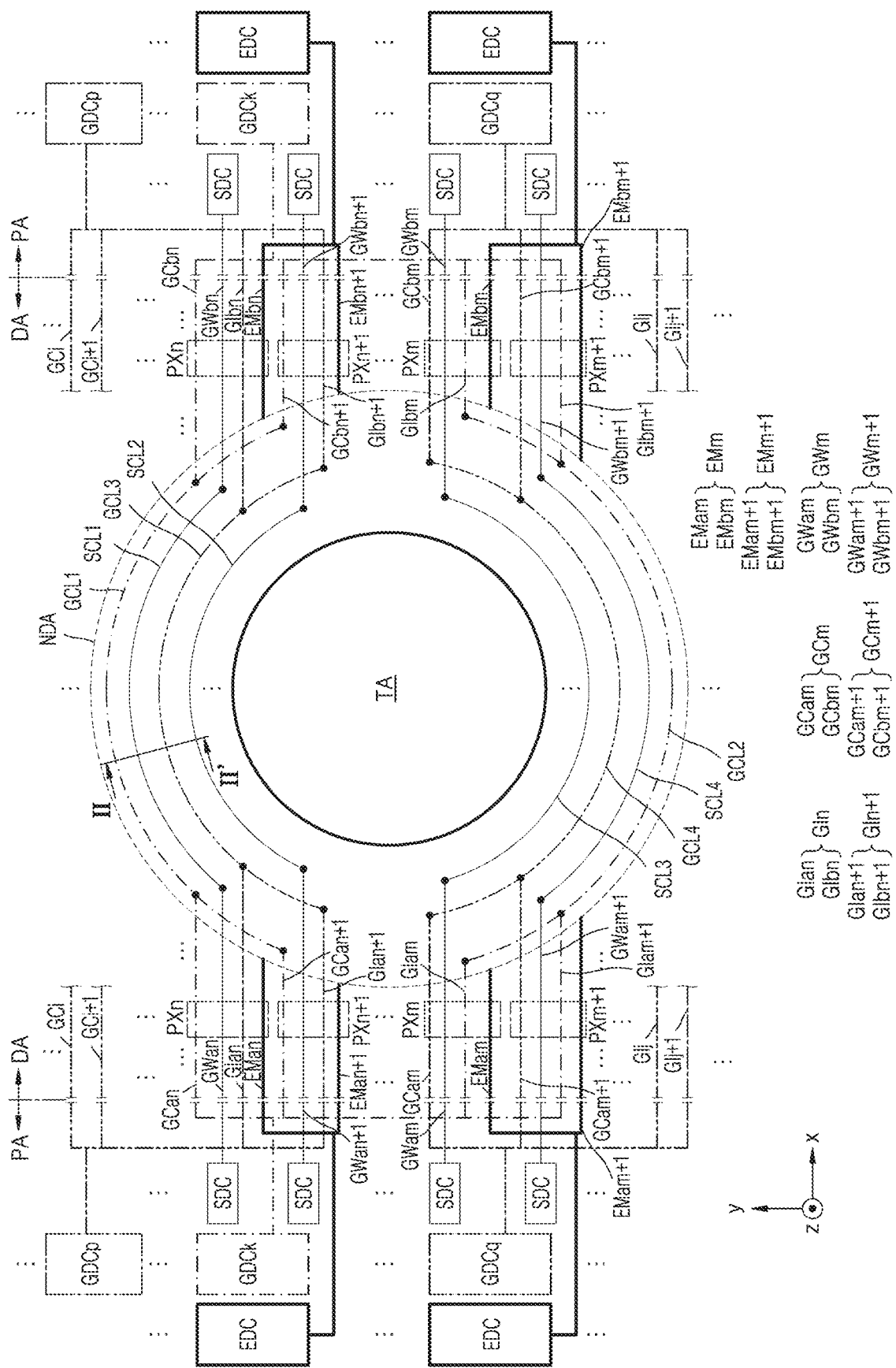
FIG. 9 is a schematic enlarged plan view of a display device according to an embodiment.

FIG. 3 illustrates an embodiment where the gate driving circuits GDC are on one side of the peripheral area PA, but in an alternative embodiment, the gate driving circuits GDC may also be on another side (a side opposite to the one side) of the peripheral area PA. In such an embodiment, the gate driving circuits GDC may be on one side and/or another side of the peripheral area PA. FIG. 9 illustrates an embodiment in which the gate driving circuits GDC are on one side and another side of the peripheral area PA.

The gate driving circuits GDC on another side of the peripheral area PA may be connected to the second portions of the compensation gate lines GC and the second portions of the initialization gate lines GI. The gate driving circuits GDC on another side of the peripheral area PA may drive the second portions of the compensation gate lines GC and the second portions of the initialization gate lines GI.

In an embodiment where the transmission area TA is on one side of the display area DA, the lengths of the first portions of the compensation gate lines GC may be different from the lengths of the second portions of the compensation gate lines GC. In one embodiment, for example, where the transmission area TA is on the upper left side of the display area DA, the lengths of the second portions of the compensation gate lines GC may be greater than the lengths of the first portions of the compensation gate lines GC. Such a difference in length may cause a difference in load of an electric signal (e.g., a scan signal). Because the first portions of the compensation gate lines GC and the second portions of the compensation gate lines GC are connected to each other through the gate connection lines GCL, the difference in load may be canceled out. Such features of the compensation gate lines GC may be applied to the initialization gate line GI.

Figure 4:
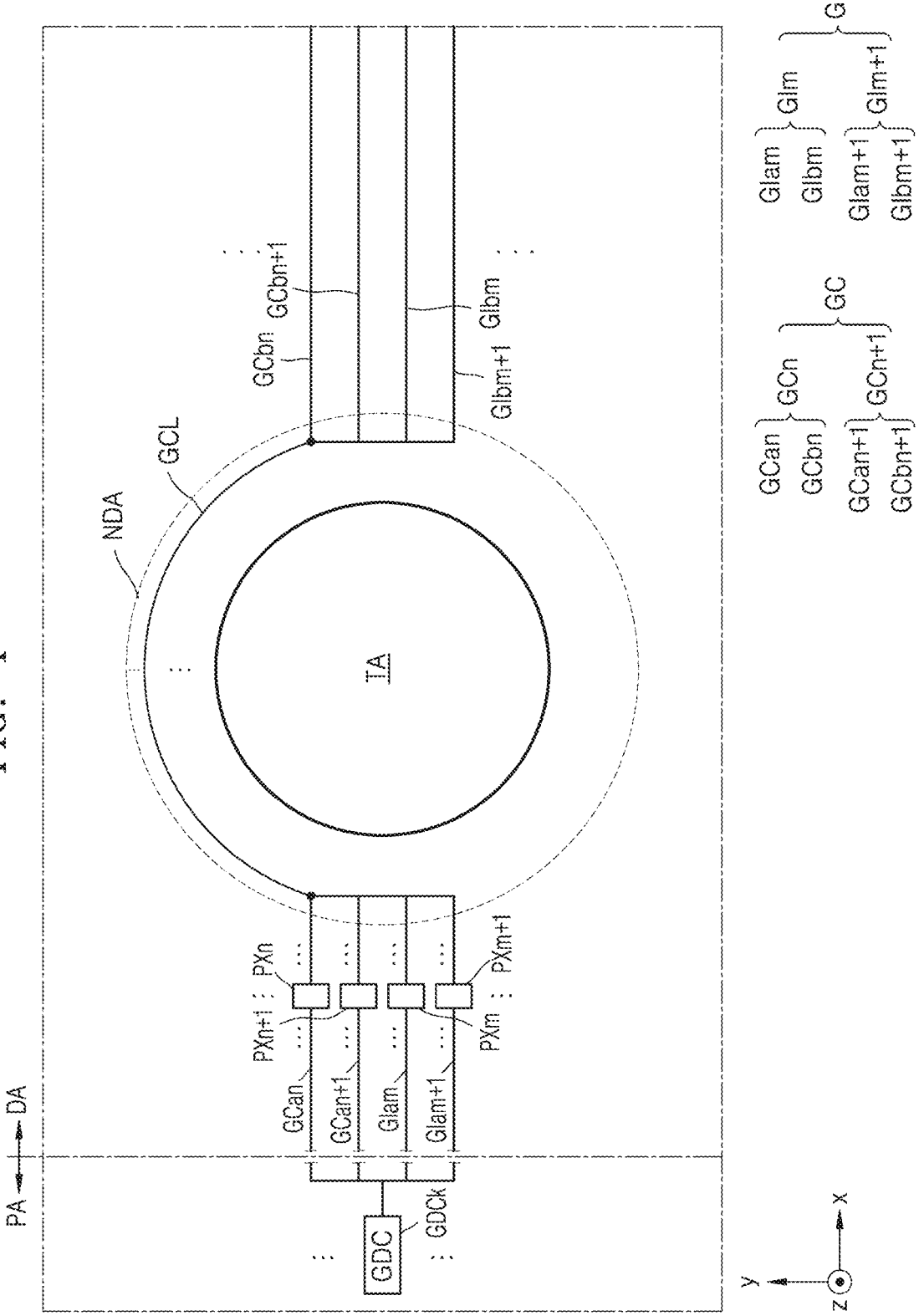
FIG. 4 is a schematic enlarged plan view of a display device according to an alternative embodiment.

FIG. 4 is a schematic enlarged plan view of a display device 10 according to an alternative embodiment. FIG. 4 is a modified embodiment of FIG. 3, in which the structure of the gate connection line is modified.

Referring to FIG. 4, in an alternative embodiment, each of the gate driving circuits GDC may simultaneously drive a plurality of compensation gate lines GC and may simultaneously drive a plurality of initialization gate lines GI. In one embodiment, for example, a k-th gate driving circuit GDCk among the gate driving circuits GDC may simultaneously drive an n-th compensation gate line GCn and an (n+1)-th compensation gate line GCn+1 among the compensation gate lines GC and an m-th initialization gate line GIm and a (m+1)-th initialization gate line GIm+1 among the initialization gate lines GI. Here, k and n are a natural number, and m is a natural number greater than n+1.

According to an embodiment, first portions and second portions of the compensation gate lines GC and the initialization gate lines GI, which are driven by the same gate driving circuit GDC, may be electrically connected to each other through a single gate connection line GCL.

In one embodiment, for example, as described above, the k-th gate driving circuit GDCk may simultaneously drive the n-th compensation gate line GCn, the (n+1)-th compensation gate line GCn+1, the m-th initialization gate line GIm, and the (m+1)-th initialization gate line GIm+1. In such an embodiment, the first portion GCan of the n-th compensation gate line GCn, the first portion GCan+1 of the (n+1)-th compensation gate line GCn+1, the first portion GIam of the m-th initialization gate line GIm, and the first portion GIam+1 of the (m+1)-th initialization gate line GIm+1 may be electrically connected to the second portion GCbn of the n-th compensation gate line GCn, the second portion GCbn+1 of the (n+1)-th compensation gate line GCn+1, the second portion GIbm of the m-th initialization gate line GIm, and the second portion GIbm+1 of the (m+1)-th initialization gate line GIm+1 through the gate connection line GCL, respectively.

In such an embodiment, as described above, the first portions and the second portions of the compensation gate lines GC and the initialization gate lines GI, which are driven by the same gate driving circuit GDC, are electrically connected to each other through a single gate connection line GCL, such that the number of gate connection lines GCL bypassing the transmission area TA may decrease, and thus, the non-display area NDA may be reduced. Therefore, the display area DA may relatively increase. In such an embodiment, the difference in load due to the difference in length between the first portions and the second portions of the compensation gate lines GC and the initialization gate lines GI may be reduced (or canceled).

Figure 5:
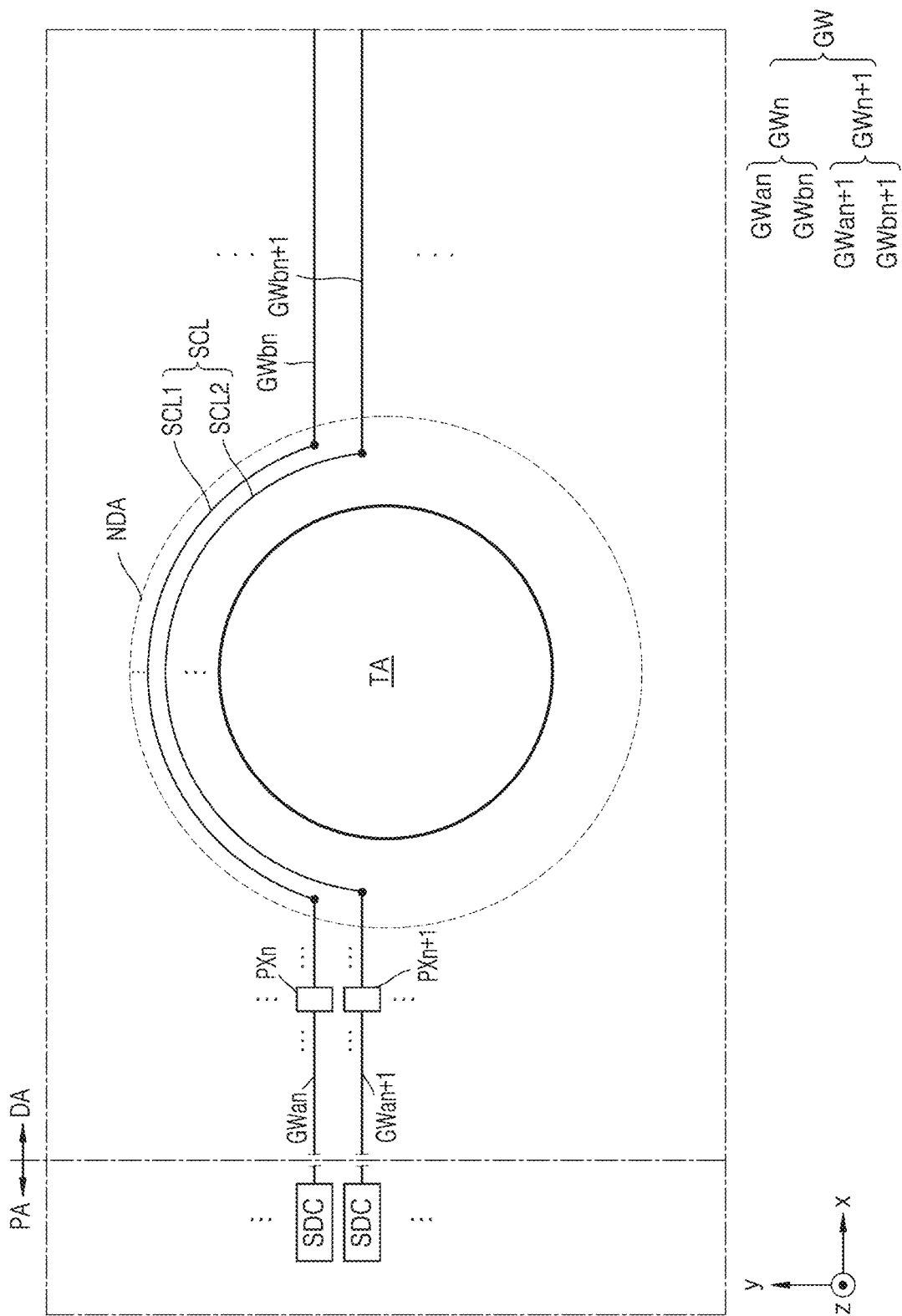
FIG. 5 is a schematic enlarged plan view of a display device according to an embodiment.

FIG. 5 is a schematic enlarged plan view of a display device according to an embodiment.

Referring to FIG. 5, in an embodiment, a plurality of scan driving circuits SDC may be in a peripheral area PA. As illustrated in FIG. 5, the scan driving circuits SDC may be arranged on the peripheral area PA in a column direction (e.g., ±x direction).

The scan driving circuits SDC may be connected to a plurality of scan lines GW arranged in pixel rows. The scan driving circuits SDC may be connected to the scan lines GW extending in a row direction (e.g., ±x direction). The scan driving circuits SDC may be configured to sequentially drive the scan lines GW.

Each of the scan lines GW may be connected to pixels PX positioned in a same row. The scan lines GW may be configured to sequentially transmit electric signals to the pixels PX positioned in the same row. In one embodiment, for example, as illustrated in FIG. 5, an n-th scan line GWn among the scan lines GW may be connected to n-th pixels PXn positioned in an n-th row, and may be configured to sequentially transmit electric signals to the n-th pixels PXn. In such an embodiment, an (n+1)-th scan line GWn+1 among the scan lines GW may be connected to (n+1)-th pixels PXn+1 positioned in an (n+1)-th row, and may be configured to sequentially transmit electric signals to the (n+1)-th pixels PXn+1. n is a natural number.

According to an embodiment, each of the scan lines GW adjacent to the transmission area TA in the row direction (e.g., ±x direction) may have a first portion and a second portion that are physically apart from each other by the transmission area TA. In one embodiment, for example, as illustrated in FIG. 5, the n-th scan line GWn among the scan lines GW may have a first portion GWan and a second portion GWbn that are physically apart from each other by the transmission area TA. In such an embodiment, the (n+1)-th scan line GWn+1 among the scan lines GW may have a first portion GWan+1 and a second portion GWbn+1 that are physically apart from each other by the transmission area TA.

A plurality of scan connection lines SCL may be on the non-display area NDA between the transmission area TA and the display area DA. Each of the scan connection lines SCL may bypass the non-display area NDA along the edge of the opening 10H of the display device 10 defined or formed in the transmission area TA.

The scan connection lines SCL may electrically connect first portions to second portions of the scan lines GW apart from each other.

In one embodiment, for example, as illustrated in FIG. 5, the first portion GWan and the second portion GWbn of the n-th scan line GWn may be electrically connected to each other through a first scan connection line SCL1 among the scan connection lines SCL. In such an embodiment, the first portion GWan+1 and the second portion GWbn+1 of the (n+1)-th scan line GWn+1 may be electrically connected to each other through a second scan connection line SCL2 among the scan connection lines SCL.

In such an embodiment, because the first portions and the second portions of the scan lines GW apart from each other by the transmission area TA are connected to each other through the scan connection lines SCL, electric signals may be transmitted to the second portions of the scan lines GW.

FIG. 5 illustrates an embodiment where the scan driving circuits SDC are on one side of the peripheral area PA, but in an alternative embodiment, the scan driving circuits SDC may also be on another side (e.g., a side opposite to the one side) of the peripheral area PA. In such an embodiment, the scan driving circuits SDC may be on one side and/or another side of the peripheral area PA. FIG. 9 illustrates an embodiment in which the scan driving circuits SDC are on one side and another side of the peripheral area PA.

The scan driving circuits SDC on another side of the peripheral area PA may be connected to the second portions of the scan lines GW. The scan driving circuits SDC on another side of the peripheral area PA may drive the second portions of the scan lines GW.

In an embodiment where the transmission area TA is on one side of the display area DA, the lengths of the first portions of the scan lines GW may be different from the lengths of the second portions of the scan lines GW. In one embodiment, for example, when the transmission area TA is on the upper left side of the display area DA, the lengths of the second portions of the scan lines GW may be greater than the lengths of the first portions of the scan lines GW. Such a difference in length may cause a difference in load of an electric signal (e.g., a scan signal). In an embodiment, because the first portions of the scan lines GW and the second portions of the scan lines GW are connected to each other through the scan connection lines SCL, the difference in load may be reduced.

Figure 6:
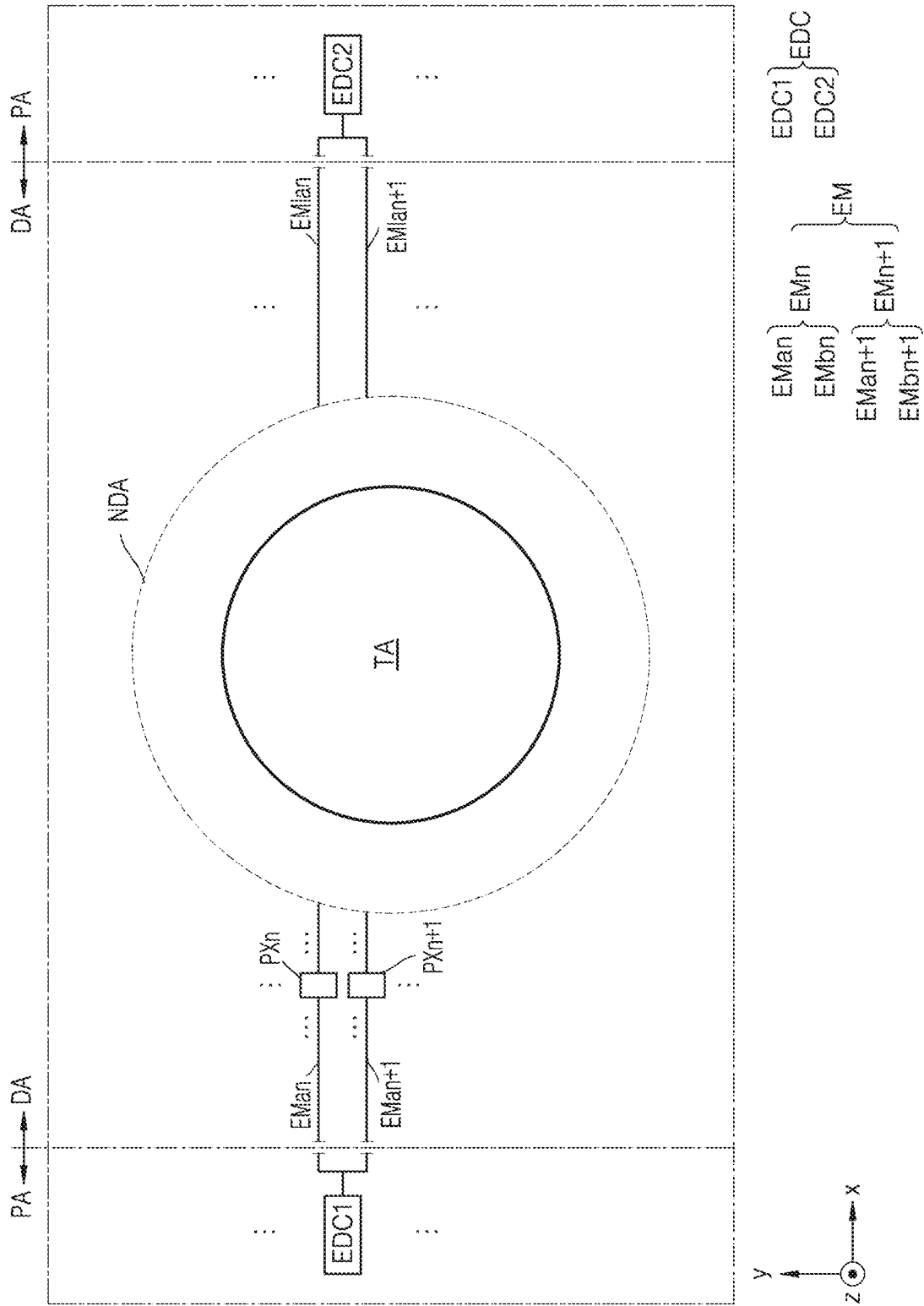
FIG. 6 is a schematic enlarged plan view of a display device according to an embodiment.

FIG. 6 is a schematic enlarged plan view of a display device according to an embodiment.

Referring to FIG. 6, in an embodiment, a plurality of emission control driving circuits EDC may be in a peripheral area PA. As illustrated in FIG. 6, the emission control driving circuits EDC may be arranged on the peripheral area PA in a column direction (e.g., ±x direction).

The emission control driving circuits EDC may be connected to a plurality of emission control lines EM arranged in pixel rows. The emission control driving circuits EDC may be connected to the emission control lines EM extending in a row direction (e.g., ±x direction).

The emission control driving circuits EDC may be on one side and another side (e.g., a side opposite to the one side) of the peripheral area PA. The emission control driving circuits EDC on one side of the peripheral area PA may be referred to as first emission control driving circuits EDC1, and the emission control driving circuits EDC on another side of the peripheral area PA may be referred to as second emission control driving circuits EDC2.

Each of the emission control lines EM may be connected to pixels PX positioned in a same row. The emission control lines EM may be configured to sequentially transmit electric signals to the pixels PX positioned in the same row. In one embodiment, for example, as illustrated in FIG. 6, an n-th emission control line EMn among the emission control lines EM may be connected to n-th pixels PXn positioned in an n-th row, and may be configured to sequentially transmit electric signals to the n-th pixels PXn. In such an embodiment, an (n+1)-th emission control line EMn+1 among the emission control lines EM may be connected to (n+1)-th pixels PXn+1 positioned in an (n+1)-th row, and may be configured to sequentially transmit electric signals to the (n+1)-th pixels PXn+1. Here, n is a natural number.

According to an embodiment, each of the emission control lines EM adjacent to the transmission area TA in the row direction (e.g., ±x direction) may have a first portion and a second portion that are physically apart from each other by the transmission area TA. In one embodiment, for example, as illustrated in FIG. 6, the n-th emission control line EMn among the emission control lines EM may have a first portion EMan and a second portion EMbn that are physically apart from each other by the transmission area TA. In such an embodiment, the (n+1)-th emission control line EMn+1 among the emission control lines EM may have a first portion EMan+1 and a second portion EMbn+1 that are physically apart from each other by the transmission area TA.

The first portions of the emission control lines EM may be driven by first emission control driving circuits EDC1 on one side of the peripheral area PA, and the second portions of the emission control lines EM may be driven by second emission control driving circuits EDC2 on another side of the peripheral area PA.

According to an embodiment, each of the emission control driving circuits EDC may simultaneously drive the emission control lines EM. The emission control lines EM, which are driven by a same emission control driving circuit EDC, may be connected to each other in the peripheral area PA.

In one embodiment, for example, as illustrated in FIG. 6, the first emission control driving circuit EDC1 on one side of the peripheral area PA among the emission control driving circuits EDC may simultaneously drive the first portion EMan of the n-th emission control line EMn and the first portion EMan+1 of the (n+1)-th emission control line EMn+1. In such an embodiment, the second emission control driving circuit EDC2 on another side of the peripheral area PA among the emission control driving circuits EDC may simultaneously drive the second portion EMbn of the n-th emission control line EMn and the second portion EMbn+1 of the (n+1)-th emission control line EMn+1.

Although FIG. 6 illustrates an embodiment where each of the emission control driving circuits EDC simultaneously drives two emission control lines EM, the number of emission control lines EM that are simultaneously driven by each of the emission control driving circuits EDC may be variously changed.

Figure 7:
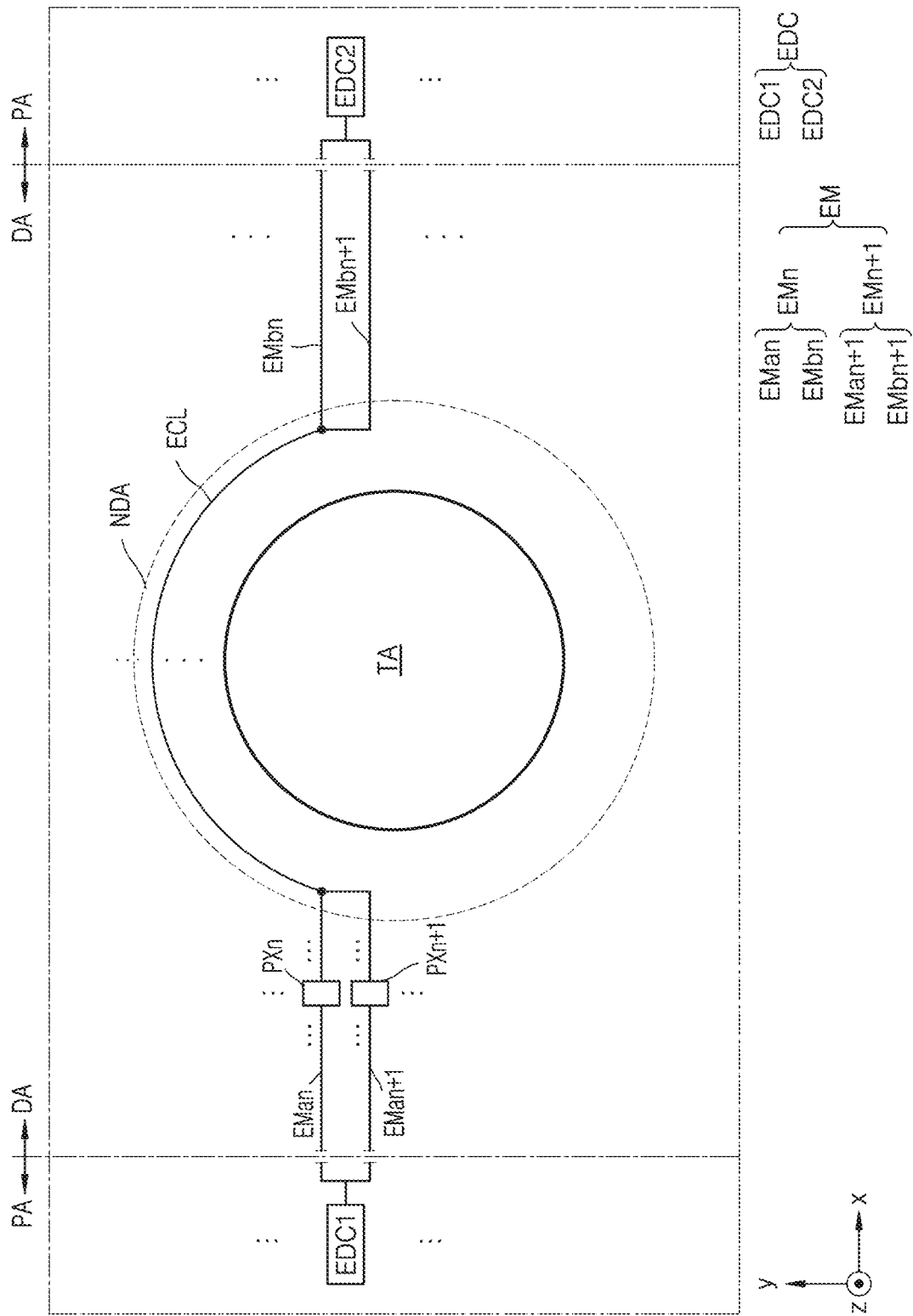
FIG. 7 is a schematic enlarged plan view of a display device according to an alternative embodiment.

FIG. 7 is a schematic enlarged plan view of a display device according to an alternative embodiment. FIG. 7 is a modified embodiment of FIG. 6, in which the structure of the gate connection line is modified.

Referring to FIG. 7, in an embodiment, a plurality of emission control connection lines ECL may be on a non-display area NDA between a transmission area TA and a display area DA. Each of the emission control connection lines ECL may bypass the non-display area NDA along the edge of the opening 10H of the display device 10 defined or defined or formed in the transmission area TA.

The emission control connection lines ECL may electrically connect first portions to second portions of the emission control lines EM apart from each other.

In one embodiment, for example, as illustrated in FIG. 7, a first portion EMan of an n-th emission control line EMn and a first portion EMan+1 of an (n+1)-th emission control line EMn+1, and a second portion EMbn of the n-th emission control line EMn and a second portion EMbn+1 of the (n+1)-th emission control line EMn+1 may be electrically connected to each other through the emission control connection line ECL.

In such an embodiment, as described above, the first portions and the second portions of the emission control lines EM driven by a same emission control driving circuit EDC may be electrically connected to each other through a single emission control connection line ECL.

FIG. 7 illustrates an embodiment where the emission control driving circuits EDC are on one side and another side of the peripheral area PA, but in an alternative embodiment, the emission control driving circuits EDC may also be on either one side or another side of the peripheral area PA. In such an embodiment, the first emission control driving circuits EDC1 or the second emission control driving circuits EDC2 may be omitted.

FIG. 8 is a schematic equivalent circuit diagram of a pixel of a display device, according to an embodiment.

Referring to FIG. 8, in an embodiment, a pixel PX may include a pixel circuit PC and a light-emitting element electrically connected to the pixel circuit PC. In one embodiment, for example, the light-emitting element may include an organic light-emitting diode OLED.

In an embodiment, as illustrated in FIG. 8, the pixel circuit PC may include a plurality of thin-film transistors T1 to T7 and a storage capacitor Cst. The thin-film transistors T1 to T7 and the storage capacitor Cst may be connected to signal lines GW, GC, GI, GB, EM, and DL, an initialization voltage line VIL, and a driving voltage line PL. According to an embodiment, at least one selected from the signal lines GW, GC, GI, GB, EM, and DL, the initialization voltage line VIL, and/or the driving voltage line PL may be shared by neighboring pixels PX.

The thin-film transistors T1 to T7 may include a driving thin-film transistor T1, a scan thin-film transistor T2, a compensation thin-film transistor T3, a gate initialization thin-film transistor T4, an operation control thin-film transistor T5, an emission control thin-film transistor T6, and an anode initialization thin-film transistor T7.

Some of the thin-film transistors T1 to T7 may be provided as n-channel metal oxide semiconductor field effect transistor ("MOSFET") (hereinafter, referred to as NMOS), and the others thereof may be provided as p-channel MOSFET (hereinafter, referred to as PMOS).

In one embodiment, for example, as illustrated in FIG. 8, the compensation thin-film transistor T3 and the gate initialization thin-film transistor T4 among the thin-film transistors T1 to T7 may be provided as NMOS, and the others thereof may be provided as PMOS.

According to an alternative embodiment, the compensation thin-film transistor T3, the gate initialization thin-film transistor T4, and the anode initialization thin-film transistor T7 among the thin-film transistors T1 to T7 may be provided as NMOS, and the others thereof may be provided as PMOS. Alternatively, only one of the thin-film transistors T1 to T7 may be provided as NMOS, and the others thereof may be provided as PMOS. Alternatively, all the thin-film transistors T1 to T7 may be provided as NMOS.

The signal lines includes the scan line GW configured to transmit a scan signal Sgw, the compensation gate line GC configured to transmit a compensation signal Sgc, the initialization gate line GI configured to transmit an initialization signal Sgi to the gate initialization thin-film transistor T4, the emission control line EM configured to transmit an emission control signal Sem to the operation control thin-film transistor T5 and the emission control thin-film transistor T6, the next scan line GB configured to transmit a next scan signal Sgb to the anode initialization thin-film transistor T7, and the data line DL crossing the scan line GW and configured to transmit a data signal Dm.

The driving voltage line PL is configured to transmit a first driving voltage ELVDD to the driving thin-film transistor T1, and the initialization voltage line VIL is configured to transmit an initialization voltage Vint for initializing the driving thin-film transistor T1 and the anode of the organic light-emitting diode OLED.

A gate of the driving thin-film transistor T1 is connected to the storage capacitor Cst, a source of the driving thin-film transistor T1 is connected to the driving voltage line PL via the operation control thin-film transistor T5, and a drain of the driving thin-film transistor T1 is electrically connected to the anode of the organic light-emitting diode OLED via the emission control thin-film transistor T6. The driving thin-film transistor T1 is configured to receive the data signal Dm based on the switching operation of the scan thin-film transistor T2 and supply a driving current IDLED to the organic light-emitting diode OLED.

A gate of the scan thin-film transistor T2 is connected to the scan line GW, a source of the scan thin-film transistor T2 is connected to the data line DL, and a drain of the scan thin-film transistor T2 is connected to the source of the driving thin-film transistor T1 and connected to the driving voltage line PL via the operation control thin-film transistor T5. The scan thin-film transistor T2 is turned on in response to the scan signal Sgw received through the scan line GW and performs a switching operation of transmitting the data signal Dm received through the data line DL to the source of the driving thin-film transistor T1.

A gate of the compensation thin-film transistor T3 is connected to the compensation gate line GC. A drain of the compensation thin-film transistor T3 is connected to the drain of the driving thin-film transistor T1 and connected to the anode of the organic light-emitting diode OLED via the emission control thin-film transistor T6. A source of the compensation thin-film transistor T3 is connected to a lower electrode CE1 of the storage capacitor Cst and the gate of the driving thin-film transistor T1. In such an embodiment, the source of the compensation thin-film transistor T3 is connected to a drain of the gate initialization thin-film transistor T4. The compensation thin-film transistor T3 is turned on in response to the compensation signal Sgc received through the compensation gate line GC and diode-connects the driving thin-film transistor T1 by electrically connecting the gate and the drain of the driving thin-film transistor T1 to each other.

A gate of the gate initialization thin-film transistor T4 is connected to the initialization gate line GI. A source of the gate initialization thin-film transistor T4 is connected to a source of the anode initialization thin-film transistor T7 and the initialization voltage line VIL. The drain of the gate initialization thin-film transistor T4 is connected to the lower electrode CE1 of the storage capacitor Cst, the source of the compensation thin-film transistor T3, and the gate of the driving thin-film transistor T1. The gate initialization thin-film transistor T4 is turned on in response to the initialization signal Sgi received through the initialization gate line GI and performs an initialization operation of initializing the voltage of the gate of the driving thin-film transistor T1 by transmitting the initialization voltage Vint to the gate of the driving thin-film transistor T1.

A gate of the operation control thin-film transistor T5 is connected to the emission control line EM, a source of the operation control thin-film transistor T5 is connected to the driving voltage line PL, and a drain of the operation control thin-film transistor T5 is connected to the source of the driving thin-film transistor T1 and the drain of the scan thin-film transistor T2.

A gate of the emission control thin-film transistor T6 is connected to the emission control line EM, a source of the emission control thin-film transistor T6 is connected to the drain of the driving thin-film transistor T1 and the drain of the compensation thin-film transistor T3, and a drain of the emission control thin-film transistor T6 is electrically connected to a drain of the anode initialization thin-film transistor T7 and the anode of the organic light-emitting diode OLED.

The operation control thin-film transistor T5 and the emission control thin-film transistor T6 are simultaneously turned on in response to the emission control signal Sem received through the emission control line EM and transmits the first driving voltage ELVDD to the organic light-emitting diode OLED so that the driving current IDLED flows through the organic light-emitting diode OLED.

A gate of the anode initialization thin-film transistor T7 is connected to the next scan line GB, the drain of the anode initialization thin-film transistor T7 is connected to the drain of the emission control thin-film transistor T6 and the anode of the organic light-emitting diode OLED, and the source of the anode initialization thin-film transistor T7 is connected to the source of the gate initialization thin-film transistor T4 and the initialization voltage line VIL. The anode initialization thin-film transistor T7 is turned on in response to the next scan signal Sgb received through the next scan line GB and initializes the anode of the organic light-emitting diode OLED.

In an embodiment, the next scan signal Sgb may be substantially synchronized with the scan signal Sgw. Alternatively, the next scan signal Sgb may be substantially synchronized with the scan signal Sgw of a next row. In one embodiment, for example, the next scan line GB may be substantially the same as the scan line GW of the next row. The pixels PX adjacent to each other in the column direction may share the scan line GW.

In an embodiment, as illustrated in FIG. 8, the anode initialization thin-film transistor T7 may be connected to the next scan line GB. Alternatively, the anode initialization thin-film transistor T7 may be connected to the emission control line EM and driven in response to the emission control signal Sem. The positions of the sources and drains of the thin-film transistors may be changed according to a transistor type (p-type or n-type).

The storage capacitor Cst includes the lower electrode CE1 and an upper electrode CE2. The lower electrode CE1 of the storage capacitor Cst is connected to the gate of the driving thin-film transistor T1, and the upper electrode CE2 of the storage capacitor Cst is connected to the driving voltage line PL. The storage capacitor Cst may store electric charges corresponding to the difference between the gate voltage of the driving thin-film transistor T1 and the first driving voltage ELVDD.

In an embodiment, the organic light-emitting diode OLED is connected to the pixel circuit PC and a second driving voltages ELVSS.

Although not illustrated in FIG. 8, the pixel circuit PC may include a boost capacitor including a first electrode and a second electrode. The first electrode of the boost capacitor may be connected to the gate of the scan thin-film transistor T2 and the scan line GW, and the second electrode of the boost capacitor may be connected to the source of the compensation thin-film transistor T3.

Hereinafter, operation of each pixel PX according to an embodiment will be described in detail.

During an initialization period, when the initialization signal Sgi is supplied through the initialization gate line GI, the gate initialization thin-film transistor T4 is turned on in response to the initialization signal Sgi, and the driving thin-film transistor T1 is initialized by the initialization voltage Vint supplied from the initialization voltage line VIL.

During a data programming period, when the scan signal Sgw and the compensation signal Sgc are supplied through the scan line GW and the compensation gate line GC, the scan thin-film transistor T2 and the compensation thin-film transistor T3 are turned on in response to the scan signal Sgw and the compensation signal Sgc. At this time, the driving thin-film transistor T1 is diode-connected by the turned-on compensation thin-film transistor T3 and is forward-biased.

The compensation voltage (Dm+Vth) decreased by the threshold voltage (−Vth, here the threshold voltage has a negative value) of the driving thin-film transistor T1 from the data signal Dm supplied from the data line DL is applied to the gate of the driving thin-film transistor T1.

The first driving voltage ELVDD and the compensation voltage (Dm+Vth) are applied to both ends of the storage capacitor Cst, and electric charges corresponding to the voltage difference between both ends of the storage capacitor Cst are stored in the storage capacitor Cst.

During an emission period, the operation control thin-film transistor T5 and the emission control thin-film transistor T6 are turned on in response to the emission control signal Sem received from the emission control line EM. The driving current IDLED is generated based on the voltage difference between the gate voltage of the driving thin-film transistor T1 and the first driving voltage ELVDD, and the driving current IDLED is supplied to the organic light-emitting diode OLED through the emission control thin-film transistor T6.

In an embodiment, at least one selected from the thin-film transistors T1 to T7 may include a semiconductor layer including an oxide, and the others thereof may include a semiconductor layer including silicon.

In such an embodiment, the driving thin-film transistor T1 that directly influences the brightness of the display device may include a semiconductor layer including polycrystalline silicon with high reliability. Accordingly, a high-resolution display device may be implemented.

Because the oxide semiconductor has high carrier mobility and low leakage current, the voltage drop is not great even though the driving time is long. That is, even during low-frequency driving, the color change of the image according to the voltage drop is not great, and thus, low-frequency driving may be effectively performed.

As such, the oxide semiconductor has desired characteristics of less leakage current. Therefore, at least one selected from the compensation thin-film transistor T3, the gate initialization thin-film transistor T4, and the anode initialization thin-film transistor T7, which are connected to the gate of the driving thin-film transistor T1, may include an oxide semiconductor to prevent leakage current from flowing to the gate of the driving thin-film transistor T1 and reduce power consumption.

FIG. 9 is a schematic enlarged plan view of a display device according to an embodiment. Specifically, FIG. 9 illustrates the compensation gate lines and the initialization gate lines of FIG. 3, the scan lines of FIG. 5, and the emission control lines of FIG. 6.

Referring to FIG. 9, in an embodiment, the gate driving circuits GDC (FIG. 3), the scan driving circuits SDC, and the emission control driving circuits EDC may be in the peripheral area PA. In such an embodiment, as illustrated in FIG. 9, the gate driving circuits GDC, the scan driving circuits SDC, and the emission control driving circuits EDC may be on the peripheral area PA in the column direction (e.g., ±x direction).

In such an embodiment, the gate driving circuits GDC, the scan driving circuits SDC, and the emission control driving circuit EDC may be on one side and another side of the peripheral area PA. In an alternative embodiment, as described above with reference to FIGS. 3 to 5 and 7, the gate driving circuits GDC, the scan driving circuits SDC, and the emission control driving circuit EDC may be on either one side or another side of the peripheral area PA. In such an embodiment, the gate driving circuits GDC, the scan driving circuits SDC, and the emission control driving circuit EDC on one side of the peripheral area PA may be omitted, or the gate driving circuits GDC, the scan driving circuits SDC, and the emission control driving circuits EDC on another side of the peripheral area PA may be omitted.

In an embodiment, n-th pixels PXn arranged in an n-th pixel row among the pixels PX (FIG. 3) may be connected to an n-th compensation gate line GCn (FIG. 3), an n-th scan line GWn (FIG. 5), an n-th initialization gate line GIn, and an n-th emission control line EMn (FIG. 6). In such an embodiment, (n+1)-th pixels PXn+1 arranged in an (n+1)-th pixel row among the pixels PX may be connected to an (n+1)-th compensation gate line GCn+1 (FIG. 3), an (n+1)-th scan line GWn+1 (FIG. 5), an (n+1)-th initialization gate line GIn+1, and an (n+1)-th emission control line EMn+1 (FIG. 6). Here, n is a natural number.

According to an embodiment, although not illustrated in FIG. 9, the (n+1)-th scan line GWn+1 may be connected to the n-th pixels PXn. The n-th pixels PXn and the (n+1)-th pixels PXn+1 may share the (n+1)-th scan line GWn+1. In an embodiment, as described above with reference to FIG. 8, the anode initialization thin-film transistor T7 included in each of the n-th pixels PXn may be turned on through the (n+1)-th scan line GWn+1 in the next row, and may initialize the anode of the organic light-emitting diode OLED.

In an embodiment, m-th pixels PXm arranged in an m-th pixel row among the pixels PX may be connected to an m-th compensation gate line GCm, an m-th scan line GWm, an m-th initialization gate line GIm (FIG. 3), and an m-th emission control line EMm. In such an embodiment, (m+1)-th pixels PXm+1 arranged in an (m+1)-th pixel row among the pixels PX may be connected to an (m+1)-th compensation gate line GCm+1, an (m+1)-th scan line GWm+1, an (m+1)-th initialization gate line GIm+1 (FIG. 3), and an (m+1)-th emission control line EMm+1. Here, m is a natural number greater than n+1.

According to an embodiment, although not illustrated in FIG. 9, the (m+1)-th scan line GWm+1 may be connected to the m-th pixels PXm. The m-th pixels PXm and the (m+1)-th pixels PXm+1 may share the (m+1)-th scan line GWm+1. In such an embodiment, as described above with reference to FIG. 8, the anode initialization thin-film transistor T7 included in each of the m-th pixels PXm may be turned on through the (m+1)-th scan line GWm+1 in the next row, and may initialize the anode of the organic light-emitting diode OLED.

The n-th compensation gate line GCn, the (n+1)-th compensation gate line GCn+1, the m-th initialization gate line GIm, and the (m+1)-th initialization gate line GIm+1 may be connected to the k-th gate driving circuit GDCk. The n-th compensation gate line GCn, the (n+1)-th compensation gate line GCn+1, the m-th initialization gate line GIm, and the (m+1)-th initialization gate line GIm+1 may be simultaneously driven by the k-th gate driving circuit GDCk. Here, k is a natural number.

In an embodiment, as illustrated in FIG. 9, a first portion GCan of the n-th compensation gate line GCn, a first portion GCan+1 of the (n+1)-th compensation gate line GCn+1, a first portion GIam of the m-th initialization gate line GIm, and a first portion GIam+1 of the (m+1)-th initialization gate line GIm+1 may be connected to the k-th gate driving circuit GDCk on one side of the peripheral area PA and simultaneously driven with each other. In such an embodiment, a second portion GCbn of the n-th compensation gate line GCn, a second portion GCbn+1 of the (n+1)-th compensation gate line GCn+1, a second portion GIbm of the m-th initialization gate line GIm, and a second portion GIbm+1 of the (m+1)-th initialization gate line GIm+1 may be connected to the k-th gate driving circuit GDCk on the other side of the peripheral area PA and simultaneously driven with each other.

In such an embodiment, the k-th gate driving circuit GDCk on one side of the peripheral area PA may be configured to output a first gate signal to the first portion GCan of the n-th compensation gate line GCn, the first portion GCan+1 of the (n+1)-th compensation gate line GCn+1, the first portion GIam of the m-th initialization gate line GIm, and the first portion GIam+1 of the (m+1)-th initialization gate line GIm+1, and the k-th gate driving circuit GDCk on another side of the peripheral area PA may be configured to output a second gate signal, which is the same as the first gate signal, to the second portion GCbn of the n-th compensation gate line GCn, the second portion GCbn+1 of the (n+1)-th compensation gate line GCn+1, the second portion GIbm of the m-th initialization gate line GIm, and the second portion GIbm+1 of the (m+1)-th initialization gate line GIm+1.

The first portion GCan of the n-th compensation gate line GCn and the first portion GCan+1 of the (n+1)-th compensation gate line GCn+1, and the second portion GCbn of the n-th compensation gate line GCn and the second portion GCbn+1 of the (n+1)-th compensation gate line GCn+1 may be connected to each other through a first gate connection line GCL1. The first portion GIam of the m-th initialization gate line GIm and the first portion GIam+1 of the (m+1)-th initialization gate line GIm+1, and the second portion GIbm of the m-th initialization gate line GIm and the second portion GIbm+1 of the (m+1)-th initialization gate line GIm+1 may be connected to each other through a second gate connection line GCL2.

The n-th scan line GWn, the (n+1)-th scan line GWn+1, the m-th scan line GWm, and the (m+1)-th scan line GWm+1 may be connected to the scan driving circuits SDC. The scan driving circuits SDC may sequentially drive the n-th scan line GWn, the (n+1)-th scan line GWn+1, the m-th scan line GWm, and the (m+1)-th scan line GWm+1.

In an embodiment, as illustrated in FIG. 9, the first portion GWan of the n-th scan line GWn, the first portion GWan+1 of the (n+1)-th scan line GWn+1, the first portion GWam of the m-th scan line GWm, and the first portion GWam+1 of the (m+1)-th scan line GWm+1 may be connected to the scan driving circuits SDC on one side of the peripheral area PA and may be sequentially driven. In such an embodiment, the second portion GWbn of the n-th scan line GWn, the second portion GWbn+1 of the (n+1)-th scan line GWn+1, the second portion GWbm of the m-th scan line GWm, and the second portion GWbm+1 of the (m+1)-th scan line GWm+1 may be connected to the scan driving circuits SDC on one side of the peripheral area PA and may be sequentially driven.

The n-th emission control line EMn, the (n+1)-th emission control line EMn+1, the m-th emission control line EMm, and the (m+1)-th emission control line EMm+1 may be connected to the emission control driving circuits EDC. The n-th emission control line EMn and the (n+1)-th emission control line EMn+1 may be connected to the same emission control driving circuit EDC and may be simultaneously driven. The m-th emission control line EMm and the (m+1)-th emission control line EMm+1 may be connected to the same emission control driving circuit EDC and may be simultaneously driven.

In an embodiment, as illustrated in FIG. 9, the first portion EMan of the n-th emission control line EMn, the first portion EMan+1 of the (n+1)-th emission control line EMn+1, the first portion EMam of the m-th emission control line EMm, and the first portion EMam+1 of the (m+1)-th emission control line EMm+1 may be connected to the emission control driving circuits EDC on one side of the peripheral area PA. In such an embodiment, the second portion EMbn of the n-th emission control line EMn, the second portion EMbn+1 of the (n+1)-th emission control line EMn+1, the second portion EMbm of the m-th emission control line EMm, and the second portion EMbm+1 of the (m+1)-th emission control line EMm+1 may be connected to the emission control driving circuits EDC on another side of the peripheral area PA. The first portion EMan of the n-th emission control line EMn, the first portion EMan+1 of the (n+1)-th emission control line EMn+1, the first portion EMam of the m-th emission control line EMm, and the first portion EMam+1 of the (m+1)-th emission control line EMm+1 may be apart from the second portion EMbn of the n-th emission control line EMn, the second portion EMbn+1 of the (n+1)-th emission control line EMn+1, the second portion EMbm of the m-th emission control line EMm, and the second portion EMbm+1 of the (m+1)-th emission control line EMm+1 by the transmission area TA.

The n-th initialization gate line GIn and the (n+1)-th initialization gate line GIn+1 may be connected to a p-th gate driving circuit GDCp. In an embodiment, as illustrated in FIG. 9, an i-th compensation gate line GCi and an (i+1)-th compensation gate line GCi+1 may also be connected to the p-th gate driving circuit GDCp in addition to the n-th initialization gate line GIn and the (n+1)-th initialization gate line GIn+1. The n-th initialization gate line GIn, the (n+1)-th initialization gate line GIn+1, the i-th compensation gate line GCi, and the (i+1)-th compensation gate line GCi+1 may be simultaneously driven by the p-th gate driving circuit GDCp. Here, p is a natural number less than k, and i is a natural number less than n−1.

In an embodiment, as illustrated in FIG. 9, the first portion GIan of the n-th initialization gate line GIn and the first portion GIan+1 of the (n+1)-th initialization gate line GIn+1 may be connected to the p-th gate driving circuit GDCp on one side of the peripheral area PA and may be simultaneously driven, and the second portion GIbn of the n-th initialization gate line GIn and the second portion GIbn+1 of the (n+1)-th initialization gate line GIn+1 may be connected to the p-th gate driving circuit GDCp on another side of the peripheral area PA and may be simultaneously driven.

The first portion GIan of the n-th initialization gate line GIn and the first portion GIan+1 of the (n+1)-th initialization gate line GIn+1, and the second portion GIbn of the n-th initialization gate line GIn and the second portion GIbn+1 of the (n+1)-th initialization gate line GIn+1 may be connected to each other through a third gate connection line GCL3.

The m-th compensation gate line GCm and the (m+1)-th compensation gate line GCm+1 may be connected to a q-th gate driving circuit GDCq. In an embodiment, as illustrated in FIG. 9, a j-th initialization gate line GIj and a (j+1)-th initialization gate line GIj+1 may also be connected to the q-th gate driving circuit GDCq in addition to the m-th compensation gate line GCm and the (m+1)-th compensation gate line GCm+1. The m-th compensation gate line GCm, the (m+1)-th compensation gate line GCm+1, the j-th initialization gate line GIj, and the (j+1)-th initialization gate line GIj+1 may be simultaneously driven by the q-th gate driving circuit GDCq. Here, q is a natural number greater than k, and j is a natural number greater than m+1.

In an embodiment, as illustrated in FIG. 9, the first portion GCam of the m-th compensation gate line GCm and the first portion GCam+1 of the (m+1)-th compensation gate line GCm+1 may be connected to the q-th gate driving circuit GDCq on one side of the peripheral area PA and may be simultaneously driven, and the second portion GCbm of the m-th compensation gate line GCm and the second portion GCbm+1 of the (m+1)-th compensation gate line GCm+1 may be connected to the q-th gate driving circuit GDCq on another side of the peripheral area PA and may be simultaneously driven.

According to an embodiment, the (i+1)-th pixel row may be a pixel row prior to the n-th pixel row. That is, i may be n−2. In such an embodiment, the n-th initialization gate line GIn, the (n+1)-th initialization gate line GIn+1, the i-th compensation gate line GCi, and the (i+1)-th compensation gate line GCi+1 may be simultaneously driven by a (k−1)-th gate driving circuit. That is, p may be k−1.

According to an embodiment, the m-th pixel row may be a pixel row next to or immediately subsequent to the (n+1)-th pixel row. That is, m may be n+2. In such an embodiment, the j-th pixel row may be a pixel row next to or immediately subsequent to the (m+1)-th pixel row. That is, j may be m+2. In such an embodiment, the m-th compensation gate line GCm, the (m+1)-th compensation gate line GCm+1, the j-th initialization gate line GIj, and the (j+1)-th initialization gate line GIj+1 may be simultaneously driven by a (k+1)-th gate driving circuit. That is, q may be k+1.

The driving timing of pixels PX when the (i+1)-th pixel row is a pixel row prior to the n-th pixel row and the m-th pixel row is a pixel row next to the (n+1)-th pixel row will be described later in greater detail with reference to FIG. 10.

According to an embodiment, an even number of pixel rows may be between the (i+1)-th pixel row and the n-th pixel row. In one embodiment, for example, two pixel rows may be between the (i+1)-th pixel row and the n-th pixel row. That is, i may be n−4. In such an embodiment, the n-th initialization gate line GIn, the (n+1)-th initialization gate line GIn+1, the i-th compensation gate line GCi, and the (i+1)-th compensation gate line GCi+1 may be simultaneously driven by a (k−2)-th gate driving circuit. That is, p may be k−2.

According to an embodiment, an even number of pixel rows may be between the m-th pixel row and the (n+1)-th pixel row. In one embodiment, for example, two pixel rows may be between the m-th pixel row and the (n+1)-th pixel row. That is, m may be n+4. In such an embodiment, an even number of pixel rows may be between the j-th pixel row and the (m+1)-th pixel row. In one embodiment, for example, two pixel rows may be between the j-th pixel row and the (m+1)-th pixel row. That is, j may be m+4. In such an embodiment, the m-th compensation gate line GCm, the (m+1)-th compensation gate line GCm+1, the j-th initialization gate line GIj, and the (j+1)-th initialization gate line GIj+1 may be simultaneously driven by a (k+2)-th gate driving circuit. That is, q may be k+2.

The driving timing of pixels PX when an even number of pixel rows are between the (i+1)-th pixel row and the n-th pixel row and an even number of pixel rows are between the m-th pixel row and the (n+1)-th pixel row will be described later in greater detail with reference to FIG. 11.

According to an embodiment, m+1 may be equal to 2 k. One gate driving circuit GDC may drive a total of two initialization gate lines GI. As illustrated in FIGS. 10 and 11 to be described later, the on-duration of the initialization gate line GI may be earlier than the on-duration of the compensation gate line GC. The on-duration of the initialization gate line GI may start earlier than the on-duration of the compensation gate line GC. Therefore, when referring to the order in which the gate driving circuits GDC are arranged based on the initialization gate line GI, two initialization gate lines GI are connected to one gate driving circuit GDC. Therefore, m+1 may be equal to 2 k.

Figure 10:
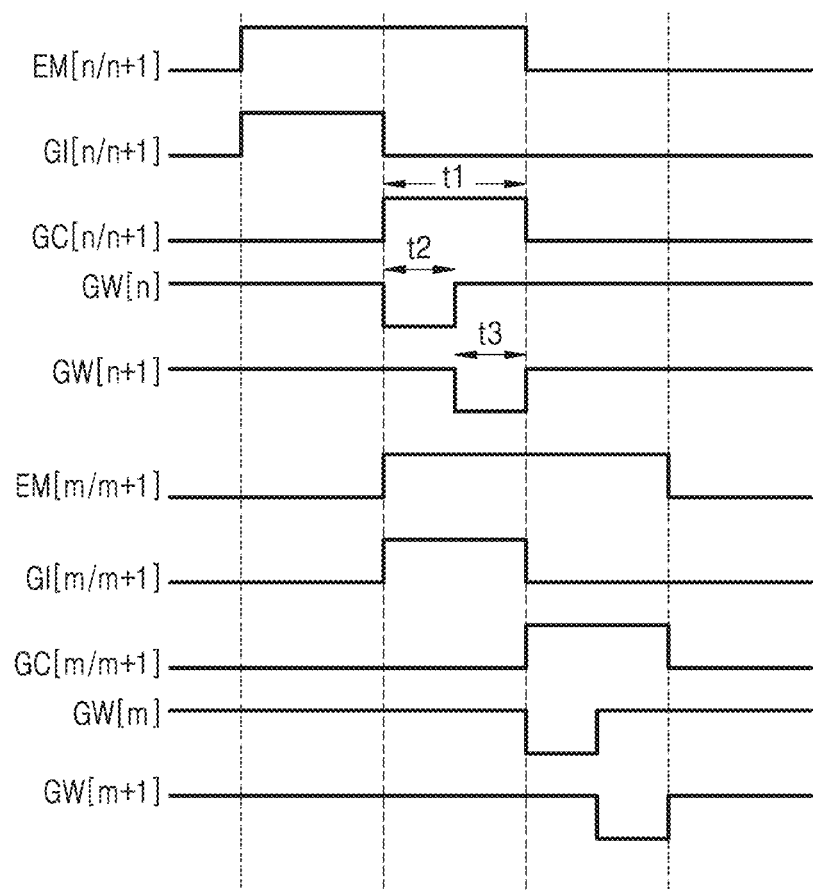
FIG. 10 is a signal timing diagram for describing a method of driving a plurality of pixels, according to an embodiment.
Figure 11:
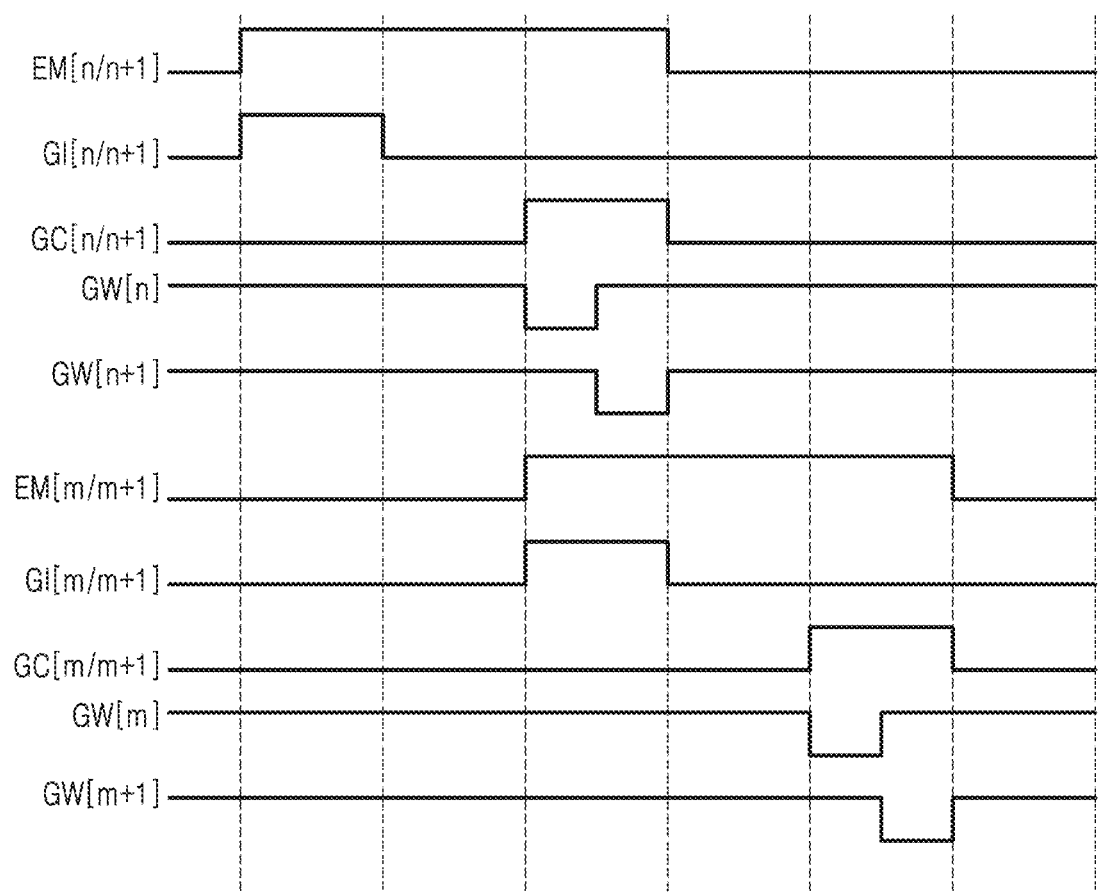
FIG. 11 is a signal timing diagram for describing a method of driving a plurality of pixels, according to an alternative embodiment.

FIGS. 10 and 11 are signal timing diagrams for describing a method of driving a plurality of pixels, according to an embodiment. Specifically, FIG. 10 is a signal timing diagram of a case in which the (i+1)-th pixel row is a pixel row prior to the n-th pixel row and the m-th pixel row is a pixel row next to or immediately subsequent to the (n+1)-th pixel row in FIG. 9, and FIG. 11 is a signal timing diagram of a case in which an even number of pixel rows are between the (i+1)-th pixel row and the n-th pixel row and an even number of pixel rows are between the m-th pixel row and the (n+1)-th pixel row in FIG. 9.

Referring to FIGS. 10 and 11, during the off-durations (or data programming periods) of the emission control signals EM[n/n+1] respectively transmitted to the n-th and (n+1)-th emission control lines EMn and EMn+1, the initialization signals GI[n/n+1] respectively transmitted to the n-th and (n+1)-th initialization gate lines GIn and GIn+1, the compensation signals GC[n/n+1] respectively transmitted to the n-th and (n+1)-th compensation gate lines GCn and GCn+1, and the scan signals GW[n] and GW[n+1] respectively transmitted to the n-th and (n+1)-th scan lines GWn and GWn+1 may proceed.

The on-durations of the initialization signals GI[n/n+1] respectively transmitted to the n-th and (n+1)-th initialization gate lines GIn and GIn+1 may correspond to a case in which the initialization signal is at a high level, the on-durations of the compensation signals GC[n/n+1] respectively transmitted to the n-th and (n+1)-th compensation gate lines GCn and GCn+1 may corresponds to a case in which the compensation signal is at a high level, and the on-durations of the scan signals GW[n] and GW[n+1] respectively transmitted to the n-th and (n+1)-th scan lines GWn and GWn+1 may correspond to a case in which the scan signal is at a low level. As described above with reference to FIG. 8, the initialization signal may be applied to the gate initialization thin-film transistor T4, the compensation signal may be applied to the compensation thin-film transistor T3, and the scan signal may be applied to the scan thin-film transistor T2. In such an embodiment, the compensation thin-film transistor T3 and the gate initialization thin-film transistor T4 may be NMOS, and the scan thin-film transistor T2 may be PMOS. Therefore, the on-duration of the initialization signal may correspond to a case in which the initialization signal is at a high level, the on-duration of the compensation signal may correspond to a case in which the compensation signal is at a high level, and the on-duration of the scan signal may correspond to a case in which the scan signal is at a low level.

According to an embodiment, the high level of the initialization signals GI[n/n+1] respectively transmitted to the n-th and (n+1)-th initialization gate lines GIn and GIn+1 and the high level of the compensation signals GC[n/n+1] respectively transmitted to the n-th and (n+1)-th compensation gate lines GCn and GCn+1 may be sequentially provided.

In one embodiment, for example, when the (i+1)-th pixel row is a pixel row prior to the n-th pixel row and the m-th pixel row is a pixel row next to or immediately subsequent to the (n+1)-th pixel row, the high level of the initialization signal and the high level of the compensation signal may be provided continuously, as illustrated in FIG. 10. That is, immediately after the on-duration of the initialization signal, the on-duration of the compensation signal may proceed (or start). In other words, a falling edge of the initialization signal may correspond to a rising edge of the compensation signal.

In an alternative embodiment, where an even number of pixel rows are between the (i+1)-th pixel row and the n-th pixel row and an even number of pixel rows are between the m-th pixel row and the (n+1)-th pixel row, the off-duration may be provided between the high level of the initialization signal and the high level of the compensation signal, as illustrated in FIG. 11. That is, after the on-duration of the initialization signal and the off-duration of at least one initialization signal, the on-duration of the compensation signal may start. In other words, the falling edge of the initialization signal may not correspond to the rising edge of the compensation signal.

While the compensation signals GC[n/n+1] respectively transmitted to the n-th and (n+1)-th compensation gate lines GCn and GCn+1 are in on-duration, a signal transmitted GW[n] to the n-th scan line GWn and a signal GW[n+1] transmitted to the (n+1)-th scan line GWn+1 may be in on-duration.

According to an embodiment, as illustrated in FIGS. 10 and 11, the on-duration length t1 of the compensation signal may be equal to or greater than twice the on-duration length t2 of the signal transmitted to the n-th scan line GWn. The on-duration length t1 of the compensation signal may be equal to or greater than twice the on-duration length t3 of the signal transmitted to the (n+1)-th scan line GWn+1. The on-duration length t1 of the compensation signal may be equal to or greater than the sum of the on-duration length t2 of the signal transmitted to the n-th scan line GWn and the on-duration length t3 of the signal transmitted to the (n+1)-th scan line GWn+1.

The features of the n-th and (n+1)-th emission control lines EMn and EMn+1, the n-th and (n+1)-th initialization gate lines GIn and GIn+1, the n-th and (n+1)-th compensation gate lines GCn and GCn+1, and the n-th and (n+1)-th scan lines GWn and GWn+1 described above may be applied to the m-th and (m+1)-th emission control lines EMm and EMm+1, the m-th and (m+1)-th initialization gate lines GIm and GIm+1, the m-th and (m+1)-th compensation gate lines GCm and GCm+1, and the m-th and (m+1)-th scan lines GWm and GWm+1.

However, the off-durations of the emission control signals EM[m/m+1] transmitted to the m-th and (m+1)-th emission control lines EMm and EMm+1 may proceed after the off-durations of the emission control signals EM[n/n+1] transmitted to the n-th and (n+1)-th emission control lines EMn and EMn+1. The on-durations of the initialization signals GI[m/m+1] transmitted to the m-th and (m+1)-th initialization gate lines GIm and GIm+1 may proceed after the on-durations of the initialization signals GI[n/n+1] transmitted to the n-th and (n+1)-th initialization gate lines GIn and GIn+1. The on-durations of the compensation signals GC[m/m+1] transmitted to the m-th and (m+1)-th compensation gate lines GCm and GCm+1 may proceed after the on-durations of the compensation signals GC[n/n+1] transmitted to the n-th and (n+1)-th compensation gate lines GCn and GCn+1. The on-durations of the scan signals GW[m] and GW[m+1] transmitted to the m-th and (m+1)-th scan lines GWm and GWm+1 may proceed after the on-durations of the scan signals GW[n] and GW[n+1] transmitted to the n-th and (n+1)-th scan lines GWn and GWn+1.

According to an embodiment, as illustrated in FIGS. 10 and 11, the on-durations of the compensation signals GC[n/n+1] transmitted to the n-th and (n+1)-th compensation gate lines GCn and GCn+1 may be substantially the same as the on-durations of the initialization signals GI[m/m+1] transmitted to the m-th and (m+1)-th initialization gate lines GIm and GIm+1. In such an embodiment, as described above with respect to FIG. 9, because the n-th and (n+1)-th compensation gate lines GCn and GCn+1 and the m-th and (m+1)-th initialization gate lines GIm and GIm+1 are simultaneously driven through the k-th gate driving circuit GDCk, the on-durations of the respective signals may be substantially the same as each other.

Figure 12:
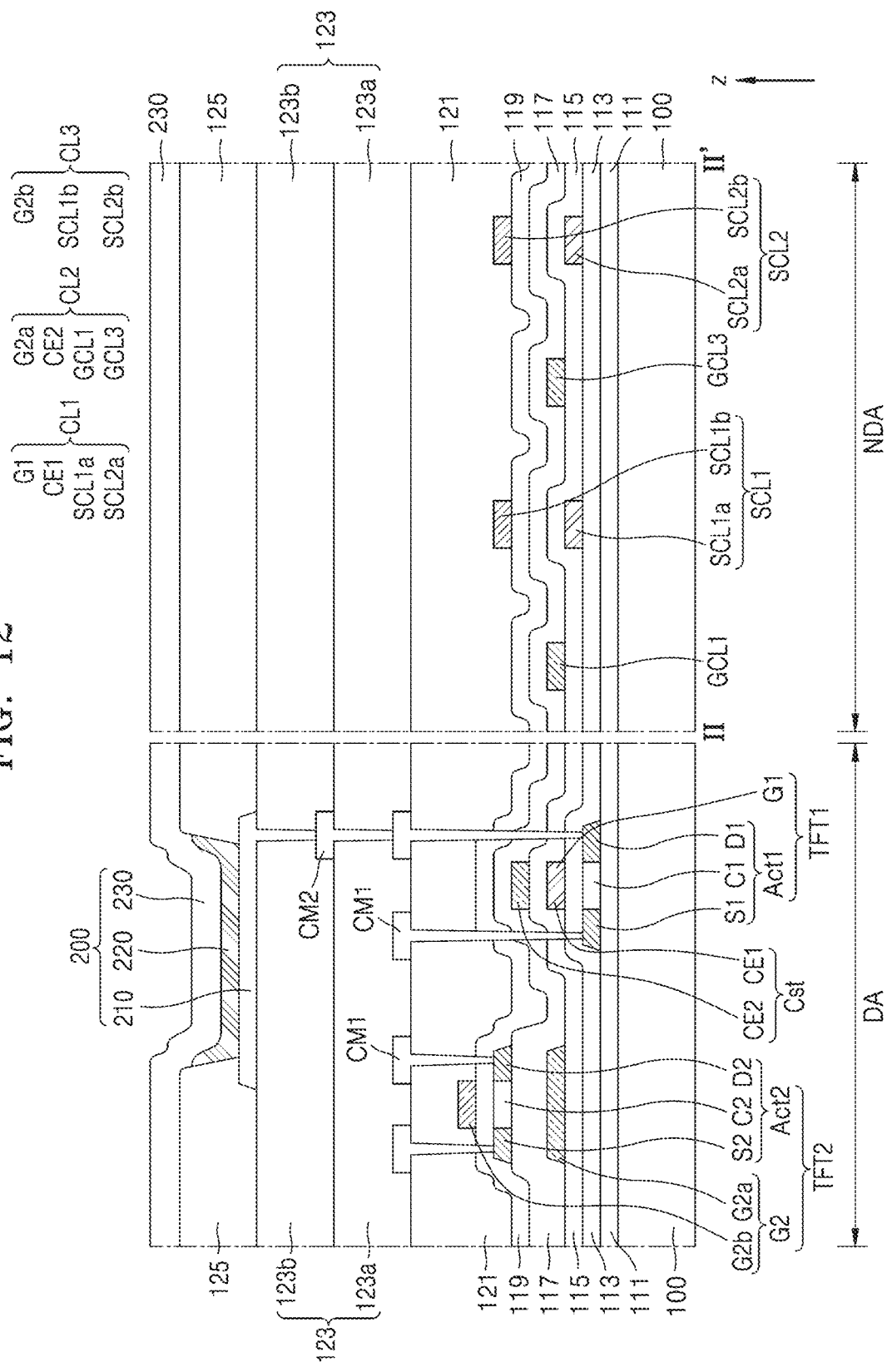
FIGS. 12 and 13 are cross-sectional views of the display device taken along line II-II' of FIG. 9.
Figure 13:
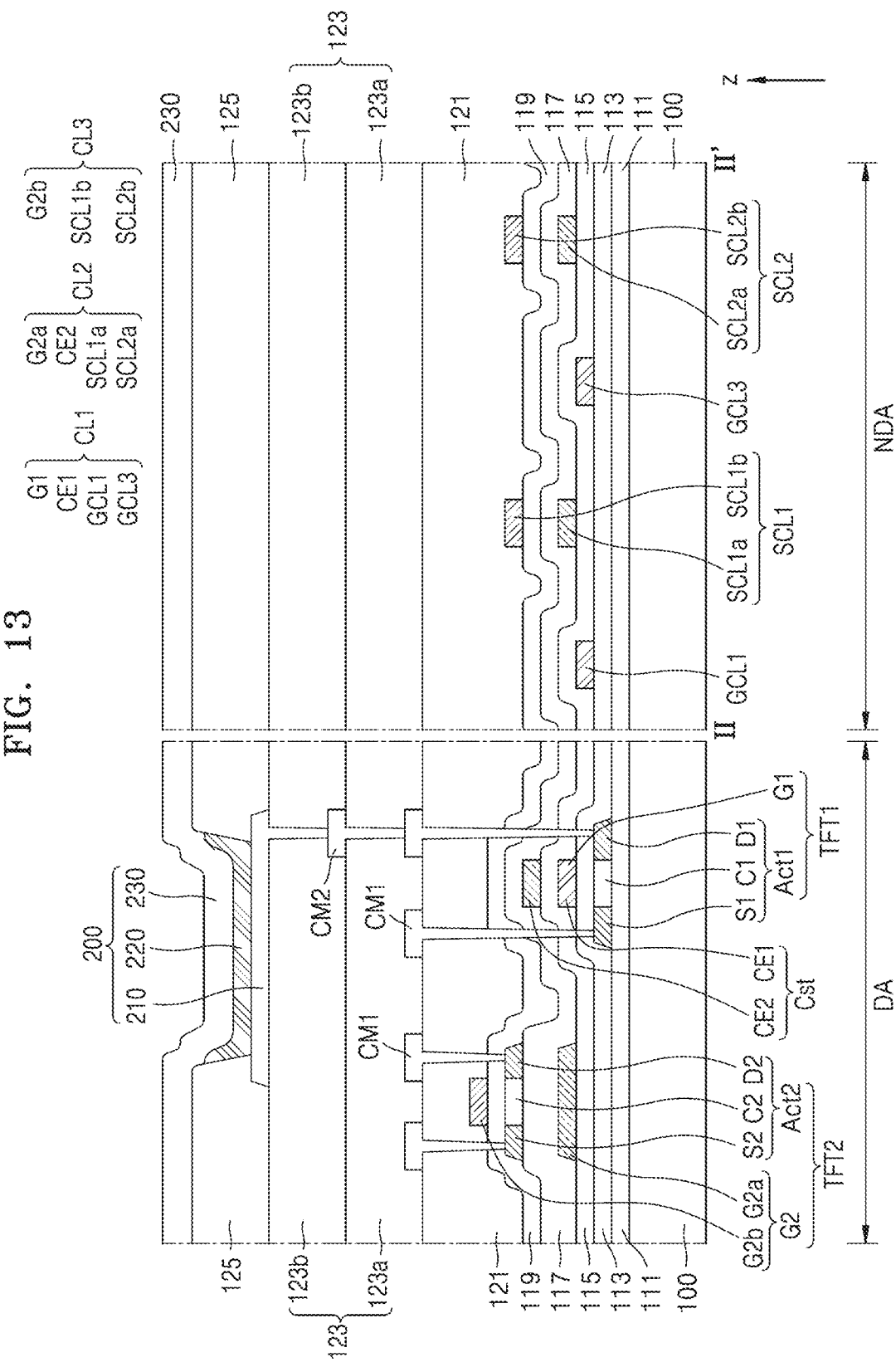

FIGS. 12 and 13 are cross-sectional views of the display device taken along line II-II' of FIG. 9. Specifically, FIGS. 12 and 13 are cross-sectional views of a portion of the display area DA and a portion of the non-display area NDA.

Referring to FIGS. 12 and 13, in an embodiment, a first scan connection line SCL1 may include a first scan connection electrode SCL1a and a second scan connection electrode SCL1b. The first scan connection electrode SCL1a may electrically connect the first portion GWan (FIG. 9) of the n-th scan line GWn (FIG. 9) to the second portion GWbn (FIG. 9) of the n-th scan line GWn (FIG. 9), and the second scan connection electrode SCL1b may electrically connect the first portion GWan of the n-th scan line GWn to the second portion GWbn of the n-th scan line GWn. The first scan connection electrode SCL1a and the second scan connection electrode SCL1b may overlap each other, as illustrated in FIGS. 12 and 13. Herein, when two elements of the display device overlap each other, the two elements overlap each other in a direction parallel to the z-axis (hereinafter, z-axis direction) or a thickness direction of the display device or a substrate 100 thereof.

Features of the first scan connection line SCL1 described above may be applied to the second scan connection line SCL2, the third scan connection line SCL3 (FIG. 9), and the fourth scan connection line SCL4. In one embodiment, for example, the second scan connection line SCL2 may include a third scan connection electrode SCL2a and a fourth scan connection electrode SCL2b. The third scan connection electrode SCL2a may electrically connect the first portion GWan+1 (FIG. 9) of the (n+1)-th scan line GWn+1 (FIG. 9) to the second portion GWbn+1 (FIG. 9) of the (n+1)-th scan line GWn+1 (FIG. 9), and the fourth scan connection electrode SCL2b may electrically connect the first portion GWan+1 of the (n+1)-th scan line GWn+1 to the second portion GWbn+1 of the (n+1)-th scan line GWn+1. The third scan connection electrode SCL2a and the fourth scan connection electrode SCL2b may overlap each other, as illustrated in FIGS. 12 and 13.

Hereinafter, the configuration of the stack structure included in the display device will be described in greater detail with reference to FIGS. 12 and 13. A positional relationship among the first gate connection line GCL1, the first scan connection line SCL1, the third gate connection line GCL3, and the second scan connection line SCL2 will be described.

In an embodiment, the display device may include the substrate 100 including a glass material, a ceramic material, a metal material, or a flexible or bendable material. In an embodiment where the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layer structure or a multilayer structure including at least one selected from the above-described material. In an embodiment where the substrate 100 has a multilayer structure, the substrate 100 may further include an inorganic layer. According to an embodiment, the substrate 100 may have an organic/inorganic/organic structure.

In an embodiment, a buffer layer 111 may be disposed on the substrate. In an embodiment, a barrier layer (not illustrated) may be further included between the substrate 100 and the buffer layer 111. The barrier layer may prevent or minimize infiltration of impurities from the substrate 100 or the like into a first semiconductor layer Act1 and a second semiconductor layer Act2. The barrier layer may include an inorganic material such as an oxide or a nitride, an organic material, or an organic/inorganic composite material, and may have a single-layer structure or a multilayer structure including an inorganic material and an organic material.

In an embodiment, a channel bottom electrode (not illustrated) may be between the barrier layer and the buffer layer 111. The channel bottom electrode may include a conductive material such as molybdenum (Mo), aluminum (Al), copper (Cu), titanium (Ti), and the like, and may include a single layer or multiple layers including at least one selected from the above-described material. In one embodiment, for example, the channel bottom electrode may have a multilayer structure of Ti/Al/Ti.

The channel bottom electrode may overlap a channel region C1 of the first semiconductor layer Act1. The channel bottom electrode may be connected to the driving voltage line PL described above with reference to FIG. 8 and configured to apply the first driving voltage ELVDD thereto. In an embodiment, a pixel circuit including an NMOS and a PMOS is driven through the channel bottom electrode to which the first driving voltage ELVDD is applied, such that undesired electric charges may be prevented from accumulating in the first semiconductor layer Act1. As a result, characteristics of a first thin-film transistor TFT1 including the first semiconductor layer Act1 may be stably maintained.

The first semiconductor layer Act1 may be on the buffer layer 111. The first semiconductor layer Act1 may include amorphous silicon or polysilicon. The first semiconductor layer Act1 may include a channel region C1, and a source region S1 and a drain region D1 on opposing sides of the channel region C1. The first semiconductor layer Act1 may include a single layer or multiple layers.

In an embodiment, a first gate insulating layer 113 and a second gate insulating layer 115 may be disposed or stacked on the substrate 100 to cover the first semiconductor layer Act1. The first gate insulating layer 113 and the second gate insulating layer 115 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

In an embodiment, a first conductive layer CL1 may be on the first gate insulating layer 113. The first conductive layer CL1 may include a conductive material such as molybdenum (Mo), aluminum (Al), copper (Cu), titanium (Ti), and the like, and may include a single layer or multiple layers including at least one selected from the above-described material. In one embodiment, for example, the first conductive layer CL1 may have a multilayer structure of Ti/Al/Ti.

The first conductive layer CL1 may include a first gate electrode G1 overlapping at least a portion of the first semiconductor layer Act1, a lower electrode CE1 of a storage capacitor Cst, a first scan connection electrode SCL1a, and a third scan connection electrode SCL2a. The first gate electrode G1 may overlap the channel region C1 of the first semiconductor layer Act1. The first gate electrode G1 and the lower electrode CE1 of the storage capacitor Cst may be in the display area DA, and the first scan connection electrode SCL1a and the third scan connection electrode SCL2a may be in the non-display area NDA.

In an embodiment, a second conductive layer CL2 may be on the second gate insulating layer 115. The second conductive layer CL2 may include a conductive material such as molybdenum (Mo), aluminum (Al), copper (Cu), titanium (Ti), and the like, and may include a single layer or multiple layers including at least one selected from the above-described material. In one embodiment, for example, the second conductive layer CL2 may have a multilayer structure of Ti/Al/Ti.

The second conductive layer CL2 may include a lower gate electrode G2a of a second gate electrode G2, an upper electrode CE2 of a storage capacitor Cst, a first gate connection line GCL1, and a second gate connection line GCL2. The lower gate electrode G2a defined by the second gate electrode G2 and the upper electrode CE2 of the storage capacitor Cst may be in the display area DA, and the first gate connection line GCL1 and the second gate connection line GCL2 may be in the non-display area NDA. The upper electrode CE2 of the storage capacitor Cst may overlap at least a portion of the first gate electrode G1.

The lower gate electrode G2a of the second gate electrode G2 may be arranged to overlap the second semiconductor layer Act2 including an oxide semiconductor material. In such an embodiment, because the second semiconductor layer Act2 including the oxide semiconductor material is vulnerable to light, the lower gate electrode G2a may prevent device characteristics of the second thin-film transistor TFT2 including an oxide semiconductor material from being changed due to photocurrent caused in the second semiconductor layer Act2 by external light incident from the substrate 100.

FIG. 12 illustrates an embodiment where the first scan connection electrode SCL1a and the third scan connection electrode SCL2a are in or directly on a same layer as the first gate electrode G1, and the first gate connection line GCL1 and the third gate connection line GCL3 are in or directly on a same layer as the upper electrode CE2, but not being limited thereto, and may be variously modified.

In one alternative embodiment, for example, as illustrated in FIG. 13, the first gate connection line GCL1 and the third gate connection line GCL3 may be in or directly on a same layer as the first gate electrode G1, and the first scan connection electrode SCL1a and the third scan connection electrode SCL2a may be in or directly on a same layer as the upper electrode CE2. In such an embodiment, the first conductive layer CL1 may include the first gate connection line GCL1 and the third gate connection line GCL3, and the second conductive layer CL2 may include the first scan connection electrode SCL1a and the third scan connection electrode SCL2a.

According to an embodiment, the storage capacitor Cst may include the lower electrode CE1 and the upper electrode CE2. In an embodiment, as illustrated in FIGS. 12 and 13, the storage capacitor Cst may overlap the first thin-film transistor TFT1. In one embodiment, for example, the first gate electrode G1 of the first thin-film transistor TFT1 may define or function as the lower electrode CE1 of the storage capacitor Cst. Alternatively, the storage capacitor Cst may not overlap the first thin-film transistor TFT1 and may be separately present.

The upper electrode CE2 of the storage capacitor Cst overlaps the lower electrode CE1 with the second gate insulating layer 115 therebetween to form a capacitor. In such an embodiment, the second gate insulating layer 115 may function as a dielectric layer of the storage capacitor Cst.

In an embodiment, a first interlayer insulating layer 117 may be on the second gate insulating layer 115 to cover the upper electrode CE2 of the storage capacitor Cst. The first interlayer insulating layer 117 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

The second semiconductor layer Act2 may be on the first interlayer insulating layer 117. The second semiconductor layer Act2 may include an oxide semiconductor material. The second semiconductor layer Act2 may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

In one embodiment, for example, the second semiconductor layer Act2 may include an InSnZnO ("ITZO") semiconductor layer, an InGaZnO ("IGZO") semiconductor layer, or the like. In such an embodiment, because the oxide semiconductor has a wide band gap (about 3.1 electronvolt (eV)), high carrier mobility, and low leakage current, the voltage drop is not great even though the driving time is long. Therefore, the luminance change according to the voltage drop is not great even during low frequency driving.

The second semiconductor layer Act2 may include a channel region C2, and a source region S2 and a drain region D2 on opposing sides of the channel region C2.

In an embodiment, a third gate insulating layer 119 may be on the second semiconductor layer Act2. The third gate insulating layer 119 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

FIGS. 12 and 13 illustrate embodiments where the third gate insulating layer 119 is on the entire surface of the substrate 100 to cover the second semiconductor layer Act2, but in an alternative embodiment, the third gate insulating layer 119 may be patterned to overlap a portion of the second semiconductor layer Act2. In one embodiment, for example, the third gate insulating layer 119 may be patterned to overlap the channel region C2 of the second semiconductor layer Act2.

In an embodiment, a third conductive layer CL3 may be on the third gate insulating layer 119. The third conductive layer CL3 may include a conductive material such as molybdenum (Mo), aluminum (Al), copper (Cu), titanium (Ti), and the like, and may include a single layer or multiple layers including at least one selected from the above-described material. In one embodiment, for example, the third conductive layer CL3 may have a multilayer structure of Ti/Al/Ti.

The third conductive layer CL3 may include an upper gate electrode G2b of the second gate electrode overlapping at least a portion of the second semiconductor layer Act2, the second scan connection electrode SCL1b, and the fourth scan connection electrode SCL2b. The upper gate electrode G2b of the second gate electrode may overlap the channel region C2 of the second semiconductor layer Act2.

According to an embodiment, the second gate electrode G2 may include the lower gate electrode G2a and the upper gate electrode G2b. The second gate electrode G2 may be multiple lines. FIGS. 12 and 13 illustrate that the second gate electrode G2 are multiple lines, but in an alternative embodiment, the second gate electrode G2 may be a single line. In one embodiment, for example, one of the lower gate electrode G2a or the upper gate electrode G2b may be omitted.

According to an embodiment, the first scan connection line SCL1 may include the first scan connection electrode SCL1a and the second scan connection electrode SCL1b, and the second scan connection line SCL2 may include the third scan connection electrode SCL2a and the fourth scan connection electrode SCL2b. Each of the first scan connection line SCL1 and the second scan connection line SCL2 may be multiple lines. A load may be reduced by configuring each of the first scan connection line SCL1 and the second scan connection line SCL2 as multiple lines.

FIGS. 12 and 13 illustrate an embodiment where the first scan connection line SCL1 and the second scan connection line SCL2 are multiple lines and the first gate connection line GCL1 and the third gate connection line GCL3 are a single line, but in an alternative embodiment, the first scan connection line SCL1 and the second scan connection line SCL2 may be a single line and the first gate connection line GCL1 and the third gate connection line GCL3 may be multiple lines. According to an alternative embodiment, the first scan connection line SCL1, the second scan connection line SCL2, the first gate connection line GCL1, and the third gate connection line GCL3 may be multiple lines or a single line.

According to an embodiment, as illustrated in FIGS. 12 and 13, the first gate connection line GCL1 and the first scan connection line SCL1 adjacent to each other may be in or directly on different layers from each other. In such an embodiment, a distance between the first gate connection line GCL1 and the first scan connection line SCL1 in a direction perpendicular to the z-axis (e.g., the horizontal direction of the substrate) may be less than a distance when the first gate connection line GCL1 and the first scan connection line SCL1 are in or directly on a same layer as each other. Therefore, the area occupied by the first gate connection line GCL1 and the first scan connection line SCL1 may be reduced. The area of the non-display area NDA in which the first gate connection line GCL1 and the first scan connection line SCL1 are arranged may be reduced. Features of the first gate connection line GCL1 and the first scan connection line SCL1 described above may be applied to the third gate connection line GCL3 and the second scan connection line SCL2.

According to an embodiment, the first thin-film transistor TFT1 may correspond to the driving thin-film transistor T1 described above with reference to FIG. 8. Except that the first thin-film transistor TFT1 overlaps the upper electrode CE2, the first thin-film transistor TFT1 may correspond to the scan thin-film transistor T2, the operation control thin-film transistor T5, the emission control thin-film transistor T6, or the anode initialization thin-film transistor T7. In such an embodiment, the first semiconductor layer Act1 may include an active region of the driving thin-film transistor T1, an active region of the scan thin-film transistor T2, an active region of the operation control thin-film transistor T5, an active region of the emission control thin-film transistor T6, or an active region of the anode initialization thin-film transistor T7.

According to an embodiment, the second thin-film transistor TFT2 may correspond to the compensation thin-film transistor T3 or the gate initialization thin-film transistor T4 described above with reference to FIG. 8. In such an embodiment, the second semiconductor layer Act2 may include an active region of the compensation thin-film transistor T3 or an active region of the gate initialization thin-film transistor T4.

In an embodiment, a second interlayer insulating layer 121 may be on the third gate insulating layer 119 to cover the third conductive layer CL3. The second interlayer insulating layer 121 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO).

In an embodiment, a first connection electrode layer CM1 may be on the second interlayer insulating layer 121. The first connection electrode layer CM1 may include a conductive material such as molybdenum (Mo), aluminum (Al), copper (Cu), titanium (Ti), and the like, and may include a single layer or multiple layers including at least one selected from the above-described material. In one embodiment, for example, the first connection electrode layer CM1 may have a multilayer structure of Ti/Al/Ti.

The first connection electrode layer CM1 may be connected to at least one selected from the source region S1 and the drain region D1 of the first semiconductor layer Act1. The first connection electrode layer CM1 may be connected to at least one selected from the source region S2 and the drain region D2 of the second semiconductor layer Act2.

The first connection electrode layer CM1 may be covered with an inorganic protective layer (not illustrated). The inorganic protective layer may include a single layer or multiple layers including at least one selected from silicon nitride ($SiN_x$) and silicon oxide ($SiO_x$). The inorganic protective layer may cover and protect some lines on the second interlayer insulating layer 121.

In an embodiment, a planarization layer 123 may be on the second interlayer insulating layer 121, and a light-emitting element 200 may be on the planarization layer 123.

The planarization layer 123 may include a single layer or multiple layers including an organic material and may provide a flat upper surface. The planarization layer 123 may include at least one selected from a general-purpose polymer (e.g., benzocyclobutene ("BCB"), polyimide, hexamethyldisiloxane ("HMDSO"), polymethylmethacrylate ("PMMA"), or polystyrene ("PS")), a polymer derivative having a phenol-based group, an acrylic polymer, an imide-based polymer, an aryl ether-based polymer, an amide-based polymer, a fluorine-based polymer, a p-xylene-based polymer and a vinyl alcohol-based polymer, for example.

In an embodiment, the planarization layer 123 may be provided in multiple layers and may include a first planarization layer 123a and a second planarization layer 123b. In such an embodiment, a second connection electrode layer CM2 may be between the first planarization layer 123a and the second planarization layer 123b. The second connection electrode layer CM2 may be connected to the first connection electrode layer CM1 through a contact hole defined in the first planarization layer 123a, and may electrically connect the light-emitting element 200 to the first thin-film transistor TFT1.

The light-emitting element 200 may be on the planarization layer 123. The light-emitting element 200 may include a pixel electrode 210, an intermediate layer 220 including an organic emission layer, and an opposite electrode 230.

The pixel electrode 210 may include a (semi)transmissive electrode or a reflective electrode. According to an embodiment, the pixel electrode 210 may include a reflective layer including at least one selected from Ag, Mg, Al, Pt, Pd, Au, Ni, Nd, Ir, Cr, and a compound thereof, and a transparent or translucent electrode layer on the reflective layer. The transparent or translucent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). According to an embodiment, the pixel electrode 210 may include ITO/Ag/ITO, for example.

In an embodiment, a pixel defining layer 125 may be on the planarization layer 123. In such an embodiment, the pixel defining layer 125 may prevent an electric arc or the like from occurring on edges of the pixel electrodes 210 by increasing distances between the edges of the pixel electrodes 210 and portions of an opposite electrode 230 on the pixel electrodes 210.

The pixel defining layer 125 may be formed through spin coating or the like by using at least one organic insulating material selected from polyimide, polyamide, acrylic resin, benzocyclobutene, and phenol resin.

The intermediate layer 220 may be in an opening defined in the pixel defining layer 125. The intermediate layer 220 may include an organic emission layer. The organic emission layer may include an organic material including a fluorescent material or a phosphorescent material that emits red light, green light, blue light, or white light. The organic emission layer may include a low molecular weight organic material or a high molecular weight organic material. In an embodiment, a hole transport layer ("HTL"), a hole injection layer ("HIL"), an electron transport layer ("ETL"), an electron injection layer ("EIL"), and the like may be optionally further arranged below and above the organic emission layer.

The intermediate layer 220 may be arranged to correspond to each of the pixel electrodes 210. However, the disclosure is not limited thereto. The intermediate layer 220 may be variously modified. In one embodiment, for example, the intermediate layer 220 may include an integrated layer over the pixel electrodes 210.

The opposite electrode 230 may include a transmissive electrode or a reflective electrode. According to an embodiment, the opposite electrode 230 may include a transparent or translucent electrode, and may include a metal thin-film having a low work function, such as Li, Ca, LiF/Ca, LiF/Al, Al, Ag, Mg, and any compound thereof. In an embodiment, a transparent conductive oxide ("TCO") layer such as ITO, IZO, ZnO, or $In_2O_3$ may be further on the metal thin-film. The opposite electrode 230 may be over the display area DA, and may be on the intermediate layer 220 and the pixel defining layer 125. The opposite electrode 230 may be integral with the light-emitting elements 200 to correspond to the pixel electrodes 210.

The light-emitting element 200 may be covered with an encapsulation layer (not illustrated). The encapsulation layer may include at least one organic encapsulation layer and at least one inorganic encapsulation layer.

The inorganic encapsulation layer may include at least one inorganic materials selected from aluminum oxide, titanium oxide, tantalum oxide, hafnium oxide, zinc oxide, silicon oxide, silicon nitride, and silicon oxynitride. The first inorganic encapsulation layer and the second inorganic encapsulation layer may include a single layer or multiple layers including at least one selected from the above-described material. The organic encapsulation layer may include a polymer-based material. The polymer-based material may include acrylic resin such as polymethyl methacrylate or polyacrylate acid, epoxy resin, polyimide, and polyethylene. According to an embodiment, the organic encapsulation layer may include an acrylate polymer.

Features of the first gate connection line GCL1, the first scan connection line SCL1, the third gate connection line GCL3, and the second scan connection line SCL2 described above may be applied to the second gate connection line GCL2 (FIG. 9), the third scan connection line SCL3 (FIG. 9), the fourth gate connection line GCL4 (FIG. 9), and the fourth scan connection line SCL4.

Only embodiments of the display device are mainly described herein, but the disclosure is not limited thereto. It will be understood that a method of manufacturing the display device, for example, also falls within the scope of the disclosure.

According to one or more embodiments, the display device in which the non-display area is reduced may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate in which a transmission area, a display area surrounding at least a portion of the transmission area, a non-display area between the transmission area and the display area, and a peripheral area outside the display area are defined;
   a plurality of pixels arranged on the display area in pixel rows and pixel columns;
   a plurality of initialization gate lines and a plurality of compensation gate lines respectively extending along the pixel rows;
   a plurality of gate driving circuits disposed on the peripheral area and arranged in a direction of the pixel columns; and
   a plurality of gate connection lines disposed on the non-display area,
   wherein a k-th gate driving circuit among the plurality of gate driving circuits simultaneously drives m-th and (m+1)-th initialization gate lines among the plurality of initialization gate lines and n-th and (n+1)-th compensation gate lines among the plurality of compensation gate lines,
   each of the m-th and (m+1)-th initialization gate lines and each of the n-th and (n+1)-th compensation gate lines include a first portion and a second portion which are physically apart from each other by the transmission area, and
   the first portion and the second portion of each of the n-th and (n+1)-th compensation gate lines are electrically connected to each other through a first gate connection line among the plurality of gate connection lines,
   wherein k and n are a natural number, and
   m is a natural number greater than n+1.

2. The display device of claim 1, wherein an even number of pixel rows are between an (n+1)-th pixel row and an m-th pixel row.

3. The display device of claim 2, wherein the first portion and the second portion of each of the m-th and (m+1)-th initialization gate lines are electrically connected to each other through a second gate connection line among the plurality of gate connection lines.

4. The display device of claim 2, wherein the first gate connection line electrically connects the first portion and the second portion of each of the m-th and (m+1)-th initialization gate lines to each other.

5. The display device of claim 1, wherein
   two pixel rows are between an (n+1)-th pixel row and an m-th pixel row,
   n-th and (n+1)-th initialization gate lines among the plurality of initialization gate lines are simultaneously driven by a (k−2)-th gate driving circuit among the plurality of gate driving circuits, and
   m-th and (m+1)-th compensation gate lines among the plurality of compensation gate lines are simultaneously driven by a (k+2)-th gate driving circuit among the plurality of gate driving circuits.

6. The display device of claim 1, wherein an m-th pixel row is a pixel row next to an (n+1)-th pixel row.

7. The display device of claim 6, wherein the first gate connection line electrically connects the first portion and the second portion of each of the m-th and (m+1)-th initialization gate lines to each other.

8. The display device of claim 6, wherein the first portion and the second portion of each of the m-th and (m+1)-th initialization gate lines are electrically connected to each other through a second gate connection line among the plurality of gate connection lines.

9. The display device of claim 1, wherein
   n-th and (n+1)-th initialization gate lines among the plurality of initialization gate lines are simultaneously driven by a (k−1)-th gate driving circuit among the plurality of gate driving circuits, and
   m-th and (m+1)-th compensation gate lines among the plurality of compensation gate lines are simultaneously driven by a (k+1)-th gate driving circuit among the plurality of gate driving circuits.

10. The display device of claim 1, wherein the m+1 is equal to 2 k.

11. The display device of claim 1, wherein the k-th gate driving circuit comprises:
    a one-side gate driving circuit disposed on one side of the peripheral area, wherein the one-side gate driving circuit outputs a first gate signal to the first portion of each of the m and (m+1)-th initialization gate lines and the first portion of each of the n-th and (n+1)-th compensation gate lines; and
    an other-side gate driving circuit disposed on another side of the peripheral area, wherein the other-side gate driving circuit outputs a second gate signal to the second portion of each of the m and (m+1)-th initialization gate lines and the second portion of each of the n-th and (n+1)-th compensation gate lines.

12. The display device of claim 1, further comprising:
    a plurality of scan lines respectively extending along the pixel rows;
    a plurality of scan driving circuits disposed on the peripheral area in a column direction, wherein the plurality of scan driving circuits sequentially drives the plurality of scan lines; and
    a plurality of scan connection lines disposed on the non-display area,
    wherein each of n-th and (n+1)-th scan lines among the plurality of scan lines includes a first portion and a second portion which are physically apart from each other by the transmission area, the first portion and the second portion of the n-th scan line are electrically connected to each other through a first scan connection line among the plurality of scan connection lines, and the first portion and the second portion of the (n+1)-th scan line are electrically connected to each other through a second scan connection line among the plurality of scan connection lines.

13. The display device of claim 12, wherein the first scan connection line comprises:
a first scan connection electrode electrically connecting the first portion of the n-th scan line to the second portion of the n-th scan line; and
a second scan connection electrode electrically connecting the first portion of the n-th scan line to the second portion of the n-th scan line.

14. The display device of claim 13, further comprising:
a first conductive layer comprising the first scan connection electrode;
a semiconductor layer on the first conductive layer; and
a second conductive layer on the semiconductor layer and comprising the second scan connection electrode.

15. The display device of claim 1, further comprising:
a plurality of emission control lines respectively extending along the pixel rows; and
a plurality of emission control driving circuits disposed on the peripheral area and arranged in the direction of the pixel columns,
wherein each of n-th and (n+1)-th emission control lines among the plurality of emission control lines includes a first portion and a second portion which are physically apart and electrically insulated from each other by the transmission area,
the first portion of the n-th emission control line and the first portion of the (n+1)-th emission control line are simultaneously driven by a first emission control driving circuit on one side of the peripheral area among the plurality of emission control driving circuits, and
the second portion of the n-th emission control line and the second portion of the (n+1)-th emission control line are simultaneously driven by a second emission control driving circuit on another side of the peripheral area among the plurality of emission control driving circuits.

16. The display device of claim 1, further comprising:
a plurality of emission control lines respectively extending along the pixel rows;
a plurality of emission control driving circuits disposed on the peripheral area and arranged in the direction of the pixel columns; and
an emission control connection line disposed on the non-display area,
wherein each of n-th and (n+1)-th emission control lines among the plurality of emission control lines includes a first portion and a second portion which are physically apart from each other by the transmission area, and
the first portion and the second portion of each of the n-th and (n+1)-th emission control lines are electrically connected to each other through the emission control connection line.

17. The display device of claim 1, wherein each of pixels arranged in an n-th pixel row among the plurality of pixels comprises:
a light-emitting element;

a driving transistor which controls a current flowing to the light-emitting element based on a gate-source voltage;
a scan transistor which transmits a data voltage to the driving transistor in response to a scan signal;
a gate initialization transistor which applies an initialization voltage to a gate of the driving transistor in response to a signal transmitted through an n-th initialization gate line among the plurality of initialization gate lines; and
a compensation transistor which connects a drain of the driving transistor to the gate of the driving transistor in response to a signal transmitted through the n-th compensation gate line.

18. The display device of claim 17, wherein a conductivity type of each of the gate initialization transistor and the compensation transistor is opposite to a conductivity type of the scan transistor.

19. The display device of claim 17, further comprising:
a first semiconductor layer comprising an active region of the scan transistor;
a second semiconductor layer comprising an active region of the gate initialization transistor and an active region of the compensation transistor; and
a conductive layer between the first semiconductor layer and the second semiconductor layer.

20. The display device of claim 19, wherein
the first semiconductor layer comprises a silicon semiconductor material, and
the second semiconductor layer comprises an oxide semiconductor material.

21. The display device of claim 17, wherein an on-duration length of the signal transmitted through the n-th compensation gate line is equal to twice an on-duration length of the scan signal or greater than the on-duration length of the scan signal.

22. The display device of claim 1, wherein a through hole is defined through the substrate to correspond to the transmission area.

23. A display device comprising:
a substrate in which a transmission area, a display area surrounding at least a portion of the transmission area, a non-display area between the transmission area and the display area, and a peripheral area outside the display area are defined;
a plurality of pixels arranged on the display area in pixel rows and pixel columns;
a plurality of gate lines respectively extending along the pixel rows; and
a plurality of gate connection lines disposed on the non-display area,
each of m-th and (m+1)-th gate lines and n-th and (n+1)-th gate lines includes a first portion and a second portion which are physically apart from each other by the transmission area,
the first portion of each of the m-th, (m+1)-th, n-th, and (n+1)-th gate lines are connected to each other in the peripheral area, and
the first portion and the second portion of each of the m-th and (m+1)-th gate lines are electrically connected to each other through a first gate connection line among the plurality of gate connection lines,
wherein n is a natural number, and
m is a natural number greater than n+1.

24. The display device of claim 23, wherein the first portion and the second portion of each of the n-th and (n+1)-th gate lines are electrically connected to each other through a second gate connection line among the plurality of gate connection lines.

25. The display device of claim 23, wherein the first gate connection line electrically connects the first portion and the second portion of each of the n-th and (n+1)-th gate lines to each other.

26. The display device of claim 23, wherein the second portion of each of the m-th, (m+1)-th, n-th, and (n+1)-th gate lines are connected to each other in the peripheral area.

* * * * *